(12) United States Patent
Kato

(10) Patent No.: US 6,947,327 B2
(45) Date of Patent: *Sep. 20, 2005

(54) NONVOLATILE MEMORY AND METHOD OF DRIVING THE SAME

(75) Inventor: Kiyoshi Kato, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 83 days.

This patent is subject to a terminal disclaimer.

(21) Appl. No.: 10/643,691

(22) Filed: Aug. 19, 2003

(65) Prior Publication Data

US 2005/0013164 A1 Jan. 20, 2005

Related U.S. Application Data

(63) Continuation of application No. 10/154,556, filed on May 24, 2002, now Pat. No. 6,646,922.

(30) Foreign Application Priority Data

May 31, 2001 (JP) ..................................... 2001-165938

(51) Int. Cl.$^7$ ............................................. G11C 16/00
(52) U.S. Cl. .......................... 365/185.22; 365/185.03; 365/185.2; 348/231.99
(58) Field of Search ........................ 365/185.2, 185.22, 365/185.25, 185.03; 396/211; 348/231.6, 231.99

(56) References Cited

U.S. PATENT DOCUMENTS

| | | | | |
|---|---|---|---|---|
| 5,172,338 A | | 12/1992 | Mehrotra et al. ............ | 365/185 |
| 5,469,444 A | * | 11/1995 | Endoh et al. ................ | 714/722 |
| 5,483,491 A | * | 1/1996 | Yoshioka et al. ........... | 365/200 |
| 5,493,241 A | * | 2/1996 | Landry et al. ............... | 326/105 |
| 5,748,532 A | * | 5/1998 | Tanaka et al. ......... | 365/185.18 |
| 5,754,475 A | * | 5/1998 | Bill et al. ............... | 365/185.25 |
| 5,818,762 A | | 10/1998 | Maari et al. ................ | 365/185 |
| 5,991,197 A | * | 11/1999 | Ogura et al. ........... | 365/185.11 |
| 6,044,004 A | | 3/2000 | Kramer ...................... | 365/222 |
| 6,459,614 B1 | | 10/2002 | Miwa et al. ........... | 365/185.03 |

FOREIGN PATENT DOCUMENTS

| | | |
|---|---|---|
| JP | 49-22356 | 6/1974 |
| JP | 9-035488 | 2/1997 |
| JP | 9-306182 | 11/1997 |

* cited by examiner

Primary Examiner—Tan T. Nguyen
(74) Attorney, Agent, or Firm—Cook, Alex, McFarron, Manzo, Cummings & Mehler, Ltd.

(57) ABSTRACT

The nonvolatile memory according to the present invention can precisely read information included in a memory transistor subject to a shift phenomenon because electrical read is performed on the memory transistor by using a reference voltage generated from a refresh memory transistor. Further, according to the present invention, the period of time during which the refresh operation is performed can be longer than before, which improves the reliability of information stored in the memory transistor. Furthermore, the margin between distributions of threshold voltages can be reduced, which improves the scale of integration of the multilevel nonvolatile memory.

92 Claims, 18 Drawing Sheets

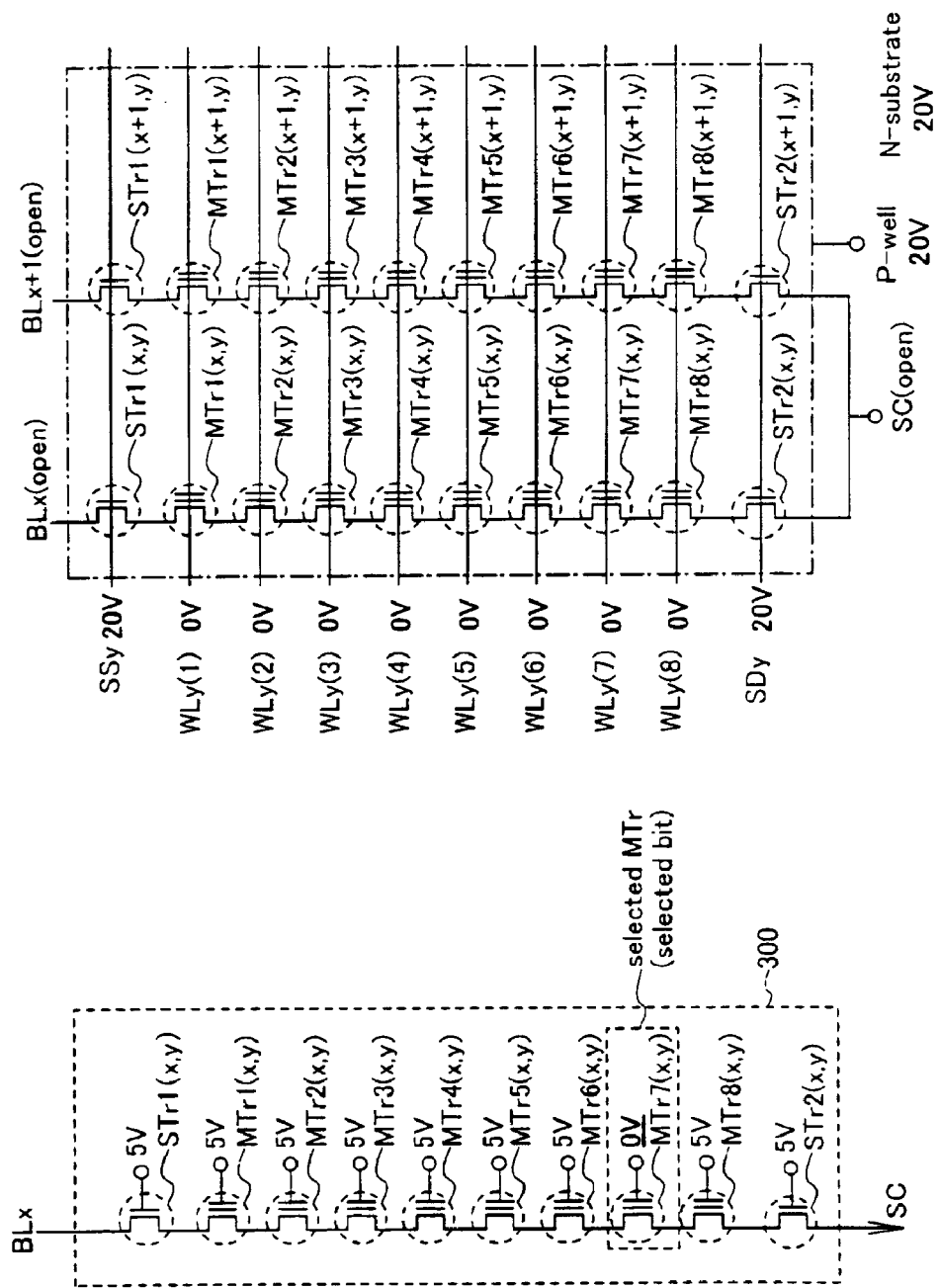

NONVOLATILE MEMORY AND METHOD OF DRIVING THE SAME

This application is a continuation of U.S. application Ser. No. 10/154,556, filed May 24, 2002 now U.S. Pat. No. 6,646,922.

BACKGROUND OF THE INVENTION

1. Field of the Invention

The present invention relates to a nonvolatile memory. More particularly, the present invention relates to a nonvolatile memory, on which electrical write and electrical erase can be performed (electrically erasable and programmable read only memory: EEPROM) and may include an EEPROM, on which electrical erase can be performed for every one bit and a flash memory.

2. Description of the Related Art

Memories may be mainly divided into two categories of volatile memories and nonvolatile memories. Typical types of volatile memories may be static random access memories (SRAM) and dynamic random access memories (DRAM). Typical types of nonvolatile memories may be EEPROM, flash EEPROM and magnetic disk. The volatile memory such as SRAM and DRAM has a drawback that data to be used is temporally stored but the data is lost when powered off. On the other hand, the nonvolatile memory such as EEPROM, flash EEPROM and magnetic disks does not lose the data even when powered off and may be used for storing a program for system start.

The nonvolatile memory such as EEPROM and flash EEPROM has a better to characteristic in scale of integration, shock-proof, power consumption, write/read speed and so on than those of magnetic disks. As a result, EEPROM and flash EEPROM may be used as alternatives of magnetic disks or the nonvolatile memories.

Especially, the scale of integration of EEPROM has been improved double for one year and is still being developed at a very fast pace. Thus, mass production of the EEPROM having some giga-bit of capacity can be expected in near future and will go beyond DRAM in scale of integration. Technologies supporting the improvement in scale of integration may include the improvement of circuit configurations, microfabrication technologies and multilevel technologies.

Among those technologies, the multilevel technologies have gathered attentions in recent years, which hold three or more values of data in one memory cell. The multilevel technologies control the amount of charges, which are accumulated in a charge-accumulated area, and discriminate three or more different states of the memory cell. In practice, quaternary flash memory is commercialized, which can distinguish four different states of the memory cell.

Now, an example of a typical circuit in a memory cell array (MCA) of an electrically programmable and electrically erasable nonvolatile memory, such as EEPROM and flash EEPROM, will be described with reference to FIG. 13.

A memory cell array 401 has m word lines (WL1 to WLm), n bit lines (BL1 to BLn), and multiple memory cells 400 arranged in a matrix manner. Each of the memory cells 400 has a memory transistor 404. The memory transistor 404 has a floating gate, a control gate, a source region and a drain region. The control gate of the memory transistor 404 is connected to any one of the word lines (WL1 to WLm). Either the source region or the drain region of the memory transistor 404 is connected to any one of bit lines (BL1 to BLn). The other is connected to a common electrode (SC). A bit line side drive circuit 402, a word line side drive circuit 403, a write/erase circuit 406*a* and a read circuit 406*b* are provided around the memory cell array 401.

FIGS. 14A to 14C schematically show sectional views of the memory transistor 404 shown in FIG. 13. Each of FIGS. 14A to 14C includes a floating gate (FG) 1, a control gate (CG) 2, a substrate 3, a source region (S) 4 and a drain region (D) 5. "e$^-$" in FIGS. 14A to 14C indicates an electron implanted to the floating gate (FG) 1. The substrate 3 is a silicon substrate to which an impurity element is added to the source region 4 and the drain region 5. Further, one conductive type is given thereto. Here, the polarity of the source region 4 and the drain region 5 is the n-type and the polarity of the substrate 3 is the p-type.

Now, a case where electrical write is performed on the memory cell 400 having binary information will be described with reference to FIG. 14B. A case where the information is electrically read out from the memory cell 400 will be described with reference to FIGS. 14C and 15A.

First of all, the electrical write on the memory cell 400 will be described with reference to FIG. 14B. It is assumed that a voltage $V_g$ (for example, 12V, here) is applied to the control gate (CG) 2. A voltage $V_d$ (for example, 6V, here) is applied to the drain region 5. The ground voltage (0 V) is applied to the source region 4. Then, the memory cell 400 is turned ON, and electrons flow from the source region 4 to the drain region 5 in the memory cell 400. Applying voltages (signal voltages) to the control gate (CG) 2, the source region 4 and the drain region 5 is called biasing herein.

Then, parts of electrons, which are accelerated in a pinch-off region (not shown) near the drain region 5, become channel hot electrons (CHE), which are captured by the floating gate (FG) 1. In other words, parts of electrons which become hot electrons (HE) are accumulated in the floating gate (FG) 1. An amount of electrons accumulated in the floating gate (FG) 1 is determined by three factors including a threshold voltage before biased, voltages applied to the control gate (CG) 2, the source region 4 and the drain region 5 of the memory transistor when biased, and a time when the voltages are applied.

When electrons are implanted to the floating gate (FG) 1, the threshold voltage of the memory cell 400 is increased. Which information between "0" and "1" the memory cell 400 has is determined based on the threshold voltage of the memory cell 400.

Next, electrical read performed on the memory cell 400 will be described with reference to FIGS. 14C and 15A.

FIG. 15A shows distributions of threshold voltages of the memory cell 400 (having information "1") in which electrons are implanted to the floating gate (FG) 1 and the memory cell 400 (having information "0") in which electrons are not implanted to the floating gate (FG) 1. In each of FIGS. 15A and 15B, the vertical axis indicates the threshold voltages and the horizontal axis indicates the number (the bit number) of memory cells 400 in the memory cell array 401.

As shown in FIG. 15A, the memory cell 400 having a threshold voltage of 5.0 V or higher has information "1". The memory cell 400 having a threshold lower than 5.0 V has information "0". By referring the threshold voltage 5.0 V, which information "1" or "0" the memory cell 400 has is determined. The threshold voltage is called reference voltage herein.

Now, as one example shown in FIG. 14C, a voltage $V_g$ (for example, 5 V here) is applied to the control gate (CG)

2 and a voltage $V_d$ (for example, 2V here) is applied to the drain region 5. Further, a ground potential (for example, 0 V here) is applied to the source region 4 of the memory cell 400. Under the condition, the electrical read is performed.

It is assumed that the memory cell 400 having information "0" is biased under the condition as shown in FIG. 14C. Then, the memory cell 400 is turned ON, where current flows.

On the other hand, the memory cell 400 having information "1" is biased under the condition as shown in FIG. 14C. In this case, charges are accumulated in the floating gate (FG) 1, and the threshold voltage is increased. As a result, the memory cell 400 remains in the OFF state, where current does not flow. Which information "0" or "1" the memory cell 400 has can be determined by detecting the presence of the current.

Next, the multilevel technology whereby more information can be written in one memory cell 400 by adjusting an amount of charges accumulated in the floating gate (FG) 1 will be described with reference to FIGS. 16A and 16B. FIGS. 16A and 16B shows distribution of threshold voltages of the memory cells 400 in which write is performed by using the multi-level technology.

Here, amounts of charges accumulated in the memory cell 400 are indicated by a, b, c and d, respectively. It is assumed that the proportional relationship among them is a>b>c>d. FIGS. 16A and 16B include distributions A, B, C and D. The distribution A is no a distribution of threshold voltage of the memory cell 400 when the amount of charges accumulated in the memory cell 400 is a (having information "0"). The distribution B is a distribution of threshold voltage of the memory cell 400 when the amount of charges accumulated in the memory cell 400 is b (having information "1"). The distribution C is a distribution of threshold voltage of the memory cell 400 when the amount of charges accumulated in the memory cell 400 is c (having information "2"). The distribution D is a distribution of threshold voltage of the memory cell 400 when the amount of charges accumulated in the memory cell 400 is d (having information "3").

Then, the threshold voltage distribution A ranges 0.5 V to 1.5 V. The threshold voltage distribution B ranges 1.5 V to 3.0 V. The threshold voltage distribution C ranges 3.0 V to 4.5 V. The threshold voltage distribution D ranges 4.5 V or higher. Here, three voltages of 1.5 V, 3.0 V and 4.5 V are reference voltages. An operation of the multi-level nonvolatile memory will be omitted here since it is similar to the operation of the binary nonvolatile memory.

According to the multilevel technology, the threshold voltages of the memory cells 400 are controlled such that more information can be stored in one memory cell 400, as described above.

By the way, the binary or multi-level nonvolatile memory undergoes verify operations (verify write and verify erase) for verifying that the threshold voltage of a memory transistor is within a predetermined range during an electrical write operation and electrical erase operation. Especially, an amount of electrons accumulated in the memory transistor must be controlled with high precision in the multi-level nonvolatile memory. Thus, the verify operations are necessary.

The verify operation is an operation for alternately performing a write/erase period and a read period for verifying that a state after the write/erase is within a predetermined range. Here, the verify operation will be described with reference to FIGS. 17A and 17B.

FIG. 17A shows a memory cell 400, a read circuit 406*a* and a write/erase circuit 406*b*. In FIG. 17A, the read circuit 406*a* and the write/erase circuit 406*b* are connected to the memory cell 400 located at a coordinate (x, y). Verify signals (Sv) are output from the read circuit 406*a*, and the verify signals (Sv) are input to the write/erase circuit 406*b*. The write/erase circuit 406*b* performs write/erase on the memory cell 400 by referencing the verify signals (Sv).

Next, the electrical write operation and the electrical erase operation in the verify operation will be described with reference to FIG. 17B. First of all, the read circuit 406*a* is activated (indicated as "active") and the electrical read operation is performed. Here, the write/erase circuit 406*b* does not operate (indicated as "not active"). The verify signals (Sv) output from the read circuit 406*a* become Low signals when the state of the read memory cell 400 is different from an intended state. When the state of the read memory cell 400 is the same as the intended state, the verify signals (Sv) become High signals.

When the verify signals (Sv) are Low signals, the write/erase circuit 406*b* is activated (active) after the electrical read operation ends, and write/erase is performed for a certain period of time. Next, the electrical read operation is performed again and the state of the memory cell 400 is compared with the intended state. Similarly, when the verify signals (Sv) are Low signals, write/erase is performed again for a certain period of time. These operations are repeated and end when the verify signals (Sv) are High signals. The operation is called verify operation.

When electrons are implanted in the memory cell 400 and is left as is after the threshold voltage is increased to a predetermined value, a shift phenomenon occurs where the threshold voltage of the memory cell 400 is decreased with the passage of time. The shift phenomenon occurs because electrons having been accumulated in the floating gate (FG) 1 of the memory cell 400 are released from the floating gate (FG) 1 with the passage of time.

Now, the shift phenomenon will be described with reference to FIGS. 15A to 16B.

FIG. 15A shows distributions of threshold voltages of a memory cell array immediately after electrons are implanted to a memory cell of a binary nonvolatile memory. FIG. 15B shows distributions of threshold voltages of the memory cell array after a lapse of a certain period of time. FIG. 16A shows distributions of threshold voltages of a memory cell array immediately after electrons are implanted to a memory cell of a quaternary nonvolatile memory. FIG. 16B shows distributions of threshold voltages of the memory cell array after a lapse of a certain period of time.

The binary nonvolatile memory shown in FIG. 15B has sufficient margins for in the distributions of the threshold voltages (a difference between distributions of threshold voltages). Therefore, the small reduction of the threshold voltages seems not to effect on electrical read of information very much. However, it is difficult to take margins sufficiently because the supply voltage has been reduced in the binary nonvolatile memory.

In the multi-level nonvolatile memory shown in FIG. 16B, the margin between distributions of threshold voltages is very small. Thus, the decrease in distributions of threshold voltages due to a shift phenomenon cannot be ignored. As shown in FIG. 16B, an area shaded by dashed lines in the distributions C and D has information "2" and "3", respectively. However, due to the shift phenomenon, these areas belong to distribution areas of the threshold voltages having information "1" and "2", respectively. When electrical read is performed under this condition, stored information is converted to different information. As a result, data destruction occurs.

The shift phenomenon may be caused not only by a cause with a passage of time but also by reading stress. The reading stress is a phenomenon that electrons are released due to the voltage applied to a memory cell from the floating gate (FG) 1 of a memory cell in the same row or in the same column as that of the memory cell to which the voltage is applied during the electrical read operation.

SUMMARY OF THE INVENTION

The present invention was made in view of the above-described problems. It is an object of the present invention to overcome the problems due to the shift phenomenon and reading stress with the passage of time. It is another object of the present invention to provide a binary and multilevel nonvolatile memories, which overcomes the problems, and a method of driving them.

In order to achieve the objectives, the present invention provides a nonvolatile memory having means for performing a refresh operation. Notably, a refresh operation is to implant electrons to a memory transistor and to accumulate charges again in order to prevent the electrons accumulated in the memory transistor from being released naturally, which causes data destruction, and in order to prevent electrons accumulated in the memory transistor from being released due to reading stress, which also causes data destruction. The present invention performs electrical read by using a reference voltage generated from a reference memory transistor and performs a refresh operation on both memory transistor and reference memory transistor.

According to an aspect of the present invention, there is provided a nonvolatile memory having a memory transistor and a reference memory transistor, including read means for electrically reading a threshold voltage of the memory transistor by using a threshold voltage of the reference memory transistor, first write means for performing electrical write on the memory transistor until the threshold voltage of the memory transistor is higher than a first reference voltage, and second write means for performing electrical write on the reference memory transistor until the threshold voltage of the reference memory transistor is higher than a second reference voltage.

According to another aspect of the present invention, there is provided a nonvolatile memory having a memory transistor and a reference memory transistor, including first write means for performing electrical write on the memory transistor until a first threshold voltage of the memory transistor, which is read based on a reference voltage of the reference memory transistor, and a second threshold voltage of the memory transistor, which is read based on a first reference voltage of the reference memory transistor belong to a distribution of threshold voltages for same information, and second write means for performing electrical write on the reference memory transistor until a threshold voltage of the reference memory transistor is higher than a second reference voltage.

The read means may correspond to a read circuit in which a memory transistor, a reference memory transistor, a sense amplifier circuit and so on are provided. The first write means may correspond to a memory transistor, a write circuit and so on. The second write means may correspond to a reference memory transistor, a write circuit and so on.

According to another aspect of the present invention, there is provided a method of driving a nonvolatile memory having a memory transistor and a reference memory transistor, including the steps of electrically reading a threshold voltage of the memory transistor by using a threshold voltage of the reference memory transistor, performing electrical write on the memory transistor until the threshold voltage of the memory transistor is higher than a first reference voltage, and performing electrical write on the reference memory transistor until the threshold voltage of the reference memory transistor is higher than a second reference voltage.

According to another aspect of the present invention, there is provided a method of driving a nonvolatile memory having a memory transistor and a reference memory transistor, including the steps of performing electrical write on the memory transistor until a first threshold voltage of the memory transistor, which is read based on a reference voltage of the reference memory transistor, and a second threshold voltage of the memory transistor, which is read based on a first reference voltage of the reference memory transistor belong to a distribution of threshold voltages for same information, and performing electrical write on the reference memory transistor until a threshold voltage of the reference memory transistor is higher than a second reference voltage.

BRIEF DESCRIPTION OF THE DRAWINGS

FIGS. 9A and 9B are diagrams showing a unit cell of a NAND type EEPROM;

DESCRIPTION OF THE PREFERRED EMBODIMENTS

First Embodiment

In this embodiment, a nonvolatile memory and a method of the same according to the present invention will be described with reference to FIGS. 1 to 2E. A refresh operation of the present invention can be applied to both binary and multilevel nonvolatile memories. In this embodiment, a k level nonvolatile memory will be described (k is a natural number, and $k \geq 2$).

A construction of a nonvolatile memory according to the present invention will be described with reference to FIG. 1. Then, an operation of a memory cell included in the nonvolatile memory will be described with reference to FIGS. 1 to 2E.

Figure 1:
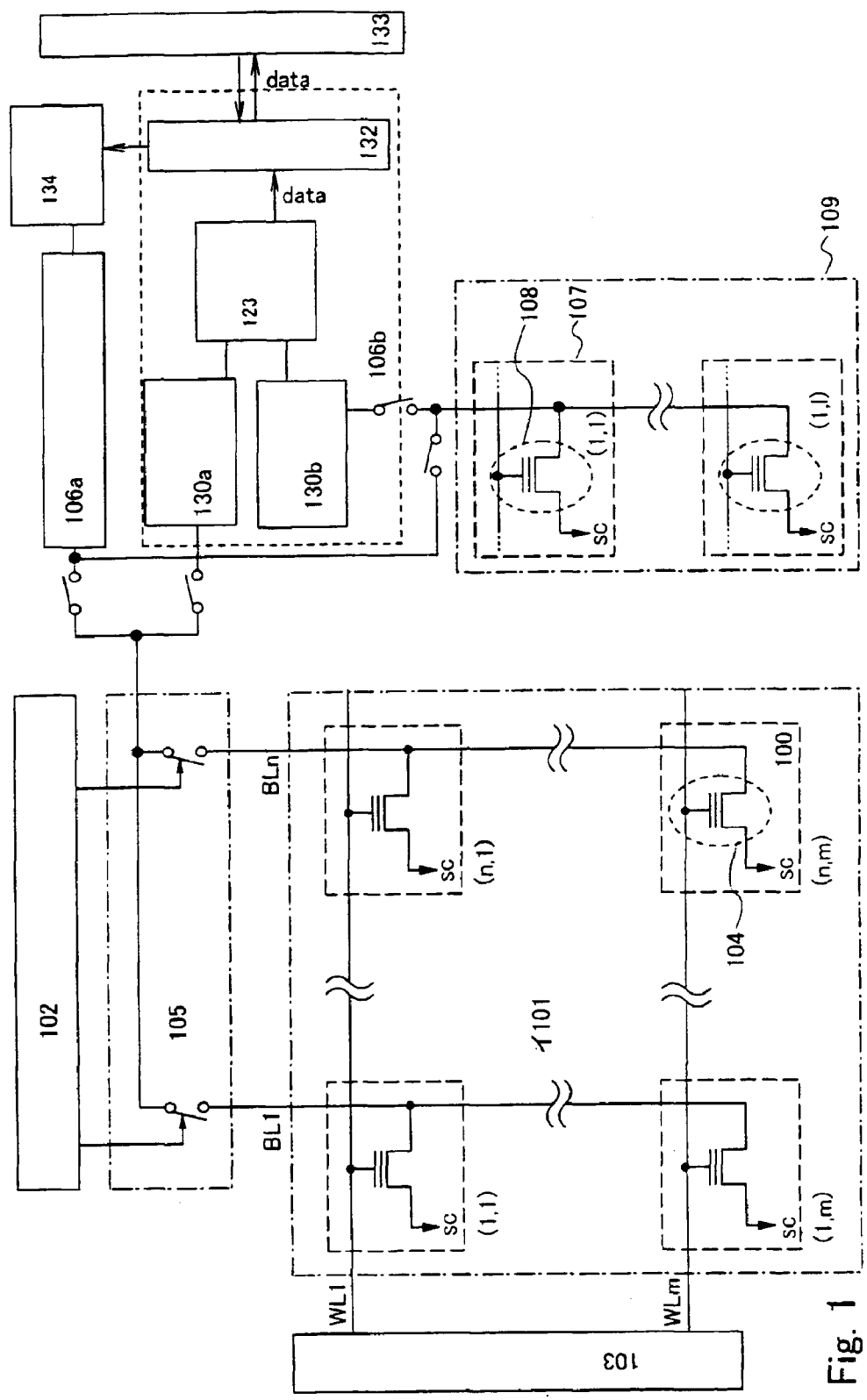
FIG. 1 shows a circuit diagram of a nonvolatile memory according to the present invention.
Figure 2:
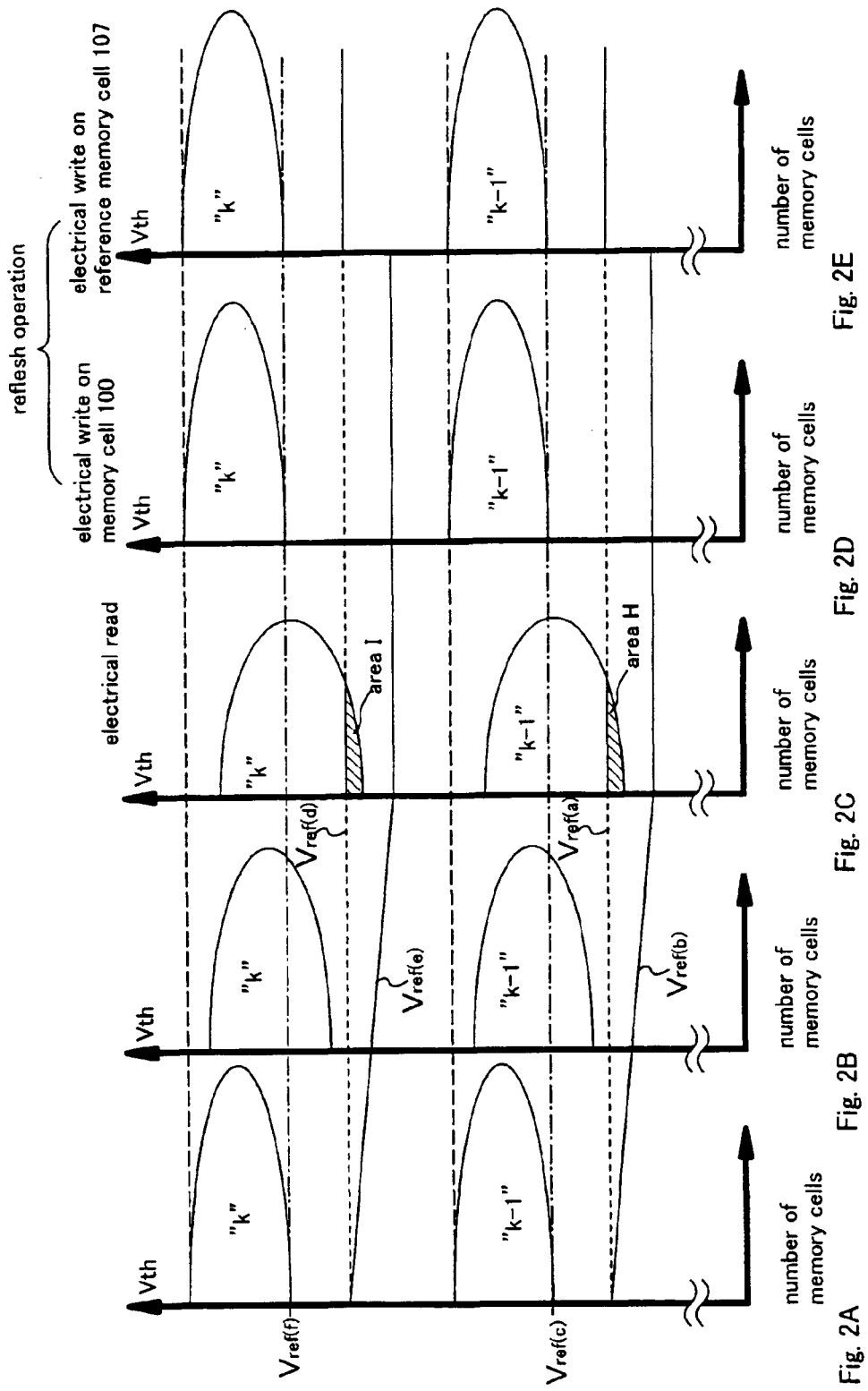
FIGS. 2A to 2E are explanatory diagrams of a shift phenomenon of a nonvolatile memory (k-logic level memory)

FIG. 1 shows a memory cell array 101 according to the present invention. A memory cell array 101 has m word lines (WL1 to WLm), n bit lines (BL1 to BLn), and multiple memory cells 100 arranged in a matrix manner. Each of the memory cells 100 has a memory transistor 104. The memory transistor 104 has a floating gate, a control gate, a source region and a drain region. The control gate of the memory transistor 104 is connected to any one of the word lines (WL1 to WLm). Either the source region or the drain region of the memory transistor 104 is connected to any one of bit lines (BL1 to BLn). The other is connected to a common electrode (SC).

A Y-address decoder 102, a word line side drive circuit 103, a multiplexer 105, a write/erase circuit 106a, a read circuit 106b, a verify circuit 134 and a buffer 133 are provided around the memory cell array 101. The read circuit 106b has a bias circuit 130a, a bias circuit 130b, a sense amplifier circuit 123 and a data latch group 132. The bias circuit 130a is connected to an arbitrary one of the memory cells 100 through the multiplexer 105. The bias circuit 130b is connected to an arbitrary one of reference memory cells 107 provided in a reference memory cell array 109.

The reference memory cell 107 has multiple reference memory transistors 108. In FIG. 1, (1×1) reference memory cells 107 are shown, but the present invention is not limited thereto. Any number of reference memory cells 107 may be provided. However, at least (k−1) reference memory cells 107 must be provided for the k level nonvolatile memory.

Next, an operation of the memory transistor included in the nonvolatile memory according to the present invention will be described with reference to FIGS. 2A to 2E. FIGS. 2A to 2E show distributions of threshold voltages of the memory cell 100 included in the k level nonvolatile memory.

In FIGS. 2A to 2E, each of horizontal axes indicates the number of memory cells 100 having information "k−1" or "k", and each of vertical axes indicates threshold voltages of the memory cells 100 having information "k−1" or "k". $V_{ref(a)}$ to $V_{ref(f)}$ indicate reference voltages.

Here, the memory cell 100 having a threshold voltage, which is higher than the reference voltage $V_{ref(a)}$ and lower than the reference voltage $V_{ref(d)}$, has information "k−1". The memory cell 100 having a threshold voltage, which is higher than the reference voltage $V_{ref(d)}$, has information "k".

FIG. 2A shows a state immediately after electrons are implanted to the floating gate of the memory cell 100. The distributions of the threshold voltages of the memory cells 100 having information "k−1" and "k" are distributions of threshold voltages within different ranges, respectively, in FIG. 2A.

FIG. 2B shows a state passed after a certain period of time from the state in FIG. 2A. By comparing between the states in FIGS. 2A and 2B, it is understood that the shift phenomenon occurs in the distributions of the threshold voltages. In other words, electrons accumulated in the memory cell 100 are released naturally. As a result, the distribution of the threshold voltages shown in FIG. 2B is lower than the distribution of threshold voltages shown in FIG. 2A.

Next, the state shown in FIG. 2C is a state passed after a certain period of time from the state in FIG. 2B. By comparing between the states in FIGS. 2B and 2C, it is understood that the shift phenomenon occurs in the distributions of the threshold voltages. In other words, electrons accumulated in the memory cell 100 are released naturally with the passage of time. As a result, the distribution of the threshold voltages shown in FIG. 2C is lower than the distribution of threshold voltages shown in FIG. 2B.

Here, information in the memory cell 100 under the state shown in FIG. 2C is read. In other words, the threshold voltage of the memory cell 100 is read in order to check which of information "k−1" and "k" the memory cell 100 has.

Under the state shown in FIG. 2C, the threshold voltage of an area I (an area shaded by sloped lines) in the distribution of the threshold voltages of the memory cell 100 having information "k" is lower than the reference voltage $V_{ref(d)}$. When the electrical read is performed on the memory cell 100 in a general manner under this state, the memory cell 100 belonging to the distribution of threshold voltages in the area I undergoes electrical read by being regarded as having information "k−1" by mistake.

Accordingly, the present invention does not use the reference voltage $V_{ref(d)}$ but uses the reference voltage $V_{ref(e)}$ generated from the reference memory cell 107. The reference voltage $V_{ref(e)}$ is a value lower than the reference voltage $V_{ref(d)}$.

The reference memory cell 107 has the same characteristics of the memory cell 100, and the similar shift phenomenon occurs in the distribution of the threshold voltages. In other words, when the reference voltage $V_{ref(e)}$ of the reference memory cell 107 is used to read a threshold voltage of the memory cell 100, the memory cell 100 belonging to the distribution of threshold voltages in the area I undergoes electrical read by being regarded as having information "k". As a result, the data destruction due to the shift phenomenon can be prevented.

The threshold voltage of an area H (an area shaded by sloped lines) in the distribution of the threshold voltages of the memory cell 104 having information "k−1" is lower than the reference voltage $V_{ref(a)}$. When the electrical read is performed on the memory cell 100 in a general manner under this state, the memory cell 100 belonging to the distribution of threshold voltages in the area H is subject to electrical read by being regarded as having information "k−2" by mistake.

Accordingly, the present invention does not use the reference voltage $V_{ref(a)}$ but uses the reference voltage $V_{ref(b)}$ generated from the reference memory cell 107. The reference voltage $V_{ref(b)}$ is a value lower than the reference voltage $V_{ref(a)}$.

The reference memory cell 107 has the same characteristics of the memory cell 100, and the similar shift phenomenon occurs in the distribution of the threshold voltages. In other words, when the reference voltage $V_{ref(b)}$ of the reference memory cell 107 is used to read a threshold voltage of the memory cell 100, the memory cell 100 belonging to the distribution of threshold voltages in the area H undergoes electrical read by being regarded as having information "k−1". As a result, the data destruction due to the shift phenomenon can be prevented.

Electrical read by using the reference memory cell 107 will be described in detail in a second embodiment.

Then, electrical write is performed on the memory cell 100 by using the reference voltages $V_{ref(e)}$ and $V_{ref(f)}$ (FIG. 2D in order to return to the state in FIG. 2A. The charges accumulated in the memory cell 100 are released naturally with the passage of time. In addition, the charges accumulated in the memory cell 100 are released due to the reading stress. Thus, a certain amount of electrons are implanted to the memory cell 100 in order to obtain a state to which charges has been just implanted to the memory cell 100 (the state in FIG. 2A).

Next, the reference voltages $V_{ref(a)}$ and $V_{ref(d)}$ ate used to perform electrical write on the reference memory cell 107 (FIG. 2E). Here, the values of the reference voltages $V_{ref(a)}$ and $V_{ref(b)}$ are the same (a state that a dashed line indicating the reference voltage $V_{ref(a)}$ and the solid line indicating the reference voltage $V_{ref(b)}$ are overlapped). Therefore, the values of the reference voltages $V_{ref(d)}$ and $V_{ref(e)}$ are the same (a state that a dotted line indicating the reference voltage $V_{ref(d)}$ and the solid line indicating the reference voltage $V_{ref(e)}$ are overlapped). In addition to the electrical write performed on the memory cell 100 in the state shown in FIG. 2D, this operation is performed in order to achieve the reference memory cell 107 and the memory cell 100 in the same state.

The reference voltage used for electrical write performed on the memory cell 100 as described above is different from the reference voltage used for electrical write performed on the reference memory cell 107. The reference voltages $V_{ref(a)}$ to $V_{ref(f)}$ are voltages generated from the reference memory cell 107 or voltages generated from an externally provided circuit, such as the bias circuit 130a and 130b.

The operations shown in FIGS. 2D and 2E are called refresh operation in combination herein.

A refresh operation is performed on the nonvolatile memory of the related art. However, the refresh operation is different from the refresh operation of the present invention. The refresh operation of the related art is an operation for implanting electrons such that the distribution of threshold voltages in the stage in FIG. 2B can be the same as the distribution of threshold voltage in the state in FIG. 2A.

According to the present invention, the reference memory cell 107 is used to perform electrical read on the memory cell 100. Thus, the interval of the refresh operations of the present invention can be longer than that of the refresh operation of the related art. The reading margin can be kept larger when the electrical read is performed. Therefore, a nonvolatile memory can be provided which hardly causes the data destruction.

Second Embodiment

In this embodiment, electrical read and refresh operations performed on a memory cell by using a reference memory cell will be described with reference to FIG. 3. Further, in this embodiment, k level nonvolatile memory (k is a natural number and k≧2) will be described in the same manner as the first embodiment.

Figure 3:
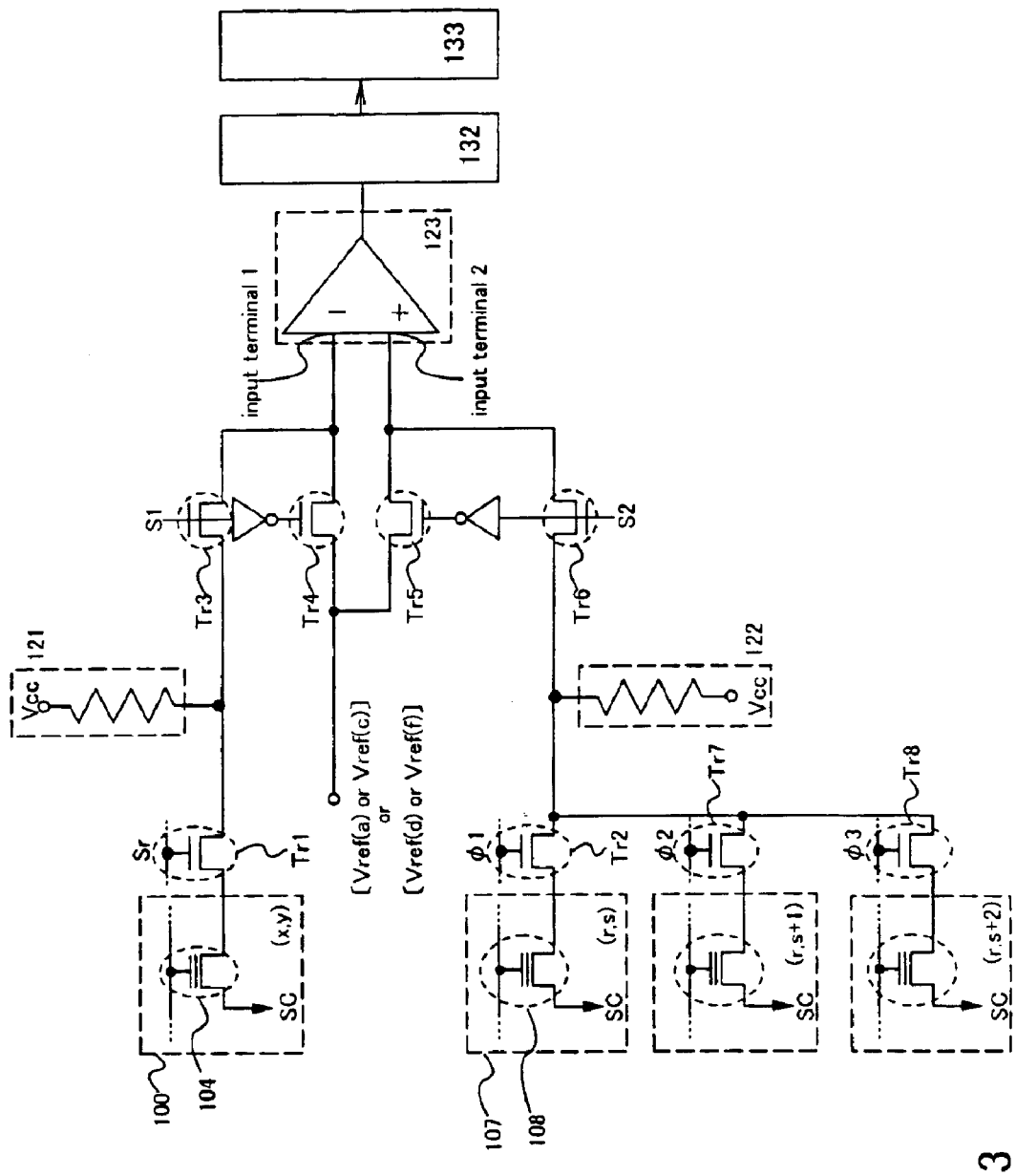
FIG. 3 is an explanatory diagram of a read circuit of a nonvolatile memory according to the present invention.

FIG. 3 is a magnified view of a portion where the memory cell 100 and the reference memory cell 107 in FIG. 1 are electrically connected through the read circuit 106b. In FIG. 3, the memory cell 100 is connected to the read circuit 106b through the multiplexer 105. For simple description, the multiplexer 105 is omitted in FIG. 3.

FIG. 3 shows a memory cell 100 at a coordinate (x, y) in the memory cell array 101. For simple description, three arbitrary reference memory cells 107 at coordinates (r, s), (r, s+1), and (r, s+2) provided in the reference memory cell array 109 are shown in FIG. 3. However, the number of reference memory cells 107 provided in the reference memory cell array 109 is not limited in particular. At least (k−1) reference memory cells 107 are only needed to provide in the reference memory cell array 109. (x, y) and (r, s) indicate coordinates, and it is assumed that 1≦x≦n, 1≦y≦m, r=1, and 1≦s≦1 (where x, y and 1 are natural numbers).

FIG. 3 includes transistors Tr1 to Tr8. A resistance 121 and a resistance 122 are circuits for generating potentials corresponding to a state of the memory transistor 104 and function as resistance in effect. In other words, the resistances 121 and 122 may have any construction if they have a function to generate potentials corresponding to a state of the memory transistor 104 in effect.

In FIG. 3, the memory cell 100 has the memory transistor 104. The source region of the memory transistor 104 is connected to a common electrode (SC). The drain region of the memory transistor 104 is connected to an input terminal 1 of the sense amplifier circuit 123. The reference memory cell 107 has the reference memory transistor 108. The source region of the reference memory transistor 108 is connected to a common electrode (SC). The drain region of the reference memory transistor 108 is connected to an input terminal 2 of the sense amplifier circuit 123.

A voltage ($V_{cc}$) is supplied to the resistances 121 and 122. A voltage ($V_{ss}$) is supplied to the common electrode (SC) to which the memory transistor 104 and the reference memory transistor 108 are connected. In many cases, a relationship of voltage ($V_{cc}$)>voltage ($V_{ss}$) is satisfied. Current flows to the resistance 121 and the memory transistor 104, which are connected in series, due to a potential difference between the voltage ($V_{cc}$) and the voltage ($V_{ss}$). Similarly, current flows to the resistance 122 and the reference memory transistor 108, which are connected in series.

The drain voltage ($V_d$) of the memory transistor 104 is determined by a ratio of an effective resistance of the memory transistor 104 and the resistance 121. Similarly, the drain voltage ($V_d$) of the reference memory transistor 108 is determined by a ratio between an effective resistance of the reference memory transistor 108 and the resistance 122. Therefore, when the resistance values of the resistance 121 and the resistance 122 are equal, and when the voltage applied to the control gate of the memory transistor 104 and the voltage applied to the control gate of the reference memory transistor 108 are equal, the proportional relationship between the drain voltage ($V_d$) of the memory transistor 104 and the drain voltage ($V_d$) of the reference memory transistor is equal to the proportional relationship between the threshold voltage of the memory transistor 104 and the threshold voltage of the reference memory transistor 108. Accordingly, the drain voltage ($V_d$) of the memory transistor 104 and the drain voltage ($V_d$) of the reference memory transistor 108 are called voltage corresponding to the threshold voltages of the memory transistor 104 and the reference memory transistor 108, respectively, herein. In addition, the drain voltages ($V_d$) of the memory transistor 104 and the reference memory transistor 108, which are determined as such, are input to the input terminals 1 and 2, respectively, of the sense amplifier circuit 123.

One of reference voltages $V_{ref(a)}$, $V_{ref(c)}$, $V_{ref(d)}$, and $V_{ref(e)}$ is input to either one of the input terminals 1 or 2 of the sense amplifier circuit 123 by turning the Tr4 or Tr5 to the ON or OFF state.

High signals are output from the sense amplifier circuit 123 when the voltage ($V_{d1}$) input to the input terminal 1 is larger than the voltage ($V_{d2}$) input to the input terminal 2.

Low signals are output therefrom when the voltage (called $V_{d1}$ hereinafter) input to the input terminal 1 is smaller than the voltage (called $V_{d2}$ herein after) input to the input terminal 2.

First of all, electrical read performed on the memory transistor 104 by using the reference memory transistor 108 will be described. Here, a reference voltage $V_{ref(e)}$ is generated from a reference memory cell 107 provided at a coordinate (r, s). A reference voltage $V_{ref(b)}$ is generated from a reference memory cell 107 provided at a coordinate (r, s+1).

Then, transistors Tr2, Tr3 and Tr6 are turned ON, while the other transistors are turned OFF. A voltage ($V_{cg}$) is applied to the memory transistor 104 and the reference memory transistor 108 at the coordinate (r, s). Under this condition, a drain voltage ($V_{dmtr}$) corresponding to the threshold voltage of the memory transistor 104 and a drain voltage ($V_{drtr}$) corresponding to the threshold voltage of the reference memory transistor 108 at the coordinate (r, s) are input to the input terminals 1 and 2 of the sense amplifier circuit 123. Then, when the threshold voltage of the memory transistor 104 is larger than the threshold voltage of the reference memory transistor 108 at the coordinate (r, s), High signals are output from the output terminal of the sense amplifier circuit 123. When the threshold voltage of the memory transistor 104 is smaller than the threshold voltage of the reference memory transistor 108 at the coordinate (r, s), Low signals are output from the output terminal of the sense amplifier circuit 123. Then, the High or Low signals output from the output terminal of the sense amplifier circuit 123 are stored in the data latch group 132.

Then, transistors Tr3, Tr6 and Tr7 are turned ON, and the other transistors are turned OFF. The voltage ($V_{cg}$) is applied to the memory transistor 104 and the reference memory transistor 108 at the coordinate (r, s+1). Under this condition, the drain voltage ($V_{dmtr}$) corresponding to the threshold voltage of the memory transistor 104 and the drain voltage ($V_{drtr}$) corresponding to the threshold voltage of the reference memory transistor 108 at the coordinate (r, s+1) are input to the input terminals 1 and 2 of the sense amplifier circuit 123. Then, when the threshold voltage of the memory transistor 104 is larger than the threshold voltage of the reference memory transistor 108 at the coordinate (r, s+1), High signals are output from the output terminal of the sense amplifier circuit 123. When the threshold voltage of the memory transistor 104 is smaller than the threshold voltage of the reference memory transistor 108 at the coordinate (r, s+1), Low signals are output from the output terminal of the sense amplifier circuit 123. Then, the High or Low signals output from the output terminal of the sense amplifier circuit 123 are stored in the data latch group 132.

In other words, electrical read is performed on the memory transistor 104 by using the reference memory transistor 108 is carried out by comparing, in the sense amplifier circuit 123, (k−1) reference voltages of the reference memory transistor 108 having zero to (k−1) pieces of information and the threshold voltage of the memory transistor 104.

In one example, a memory cell 100 has information "k" when the signals output from the sense amplifier circuit 123 are all High. In another example, when the threshold voltage of the memory transistor 104 is compared with the reference voltage $V_{ref(e)}$, High signals are output from the sense amplifier circuit 123. Further, when the threshold voltage of the memory transistor 104 is compared with the other reference voltage, Low signals are output from the sense amplifier circuit 123. In this case, the memory cell 100 has information "k−1".

Next, a refresh operation of the present invention will be described. The refresh operation of the present invention is an operation, which combines electrical write performed on the memory cell 100 and electrical write performed on the reference memory cell 107. First of all, the electrical write performed on the memory cell 100 will be described. In this embodiment, for simple description, a case will be described that reference voltages {$V_{ref(d)}$ to $V_{ref(f)}$} are used to perform electrical write on the memory cell 100 having information "k".

When electrical write (verify write) is performed on the memory cell 100, the transistors Tr1, Tr3 and Tr6 are turned ON while the other transistors are turned OFF.

As shown in FIG. 3, the drain region of the memory transistor 104 included in the memory cell 100 is connected to the input terminal 1 of the sense amplifier circuit 123. Therefore, a drain voltage ($V_{dmtr}$) of the memory transistor 104 is input to the input terminal 1 of the sense amplifier circuit 123. A drain voltage corresponding to either reference voltages $V_{ref(e)}$ or $V_{ref(f)}$ is input to the input terminal 2 of the sense amplifier circuit 123. First of all, the reference voltage $V_{ref(e)}$ is input to the input terminal 2 of the sense amplifier circuit 123. Then, electrical read is performed on the memory transistor 104, and read data (called data 1 hereinafter) is stored in the data latch group 132.

Next, the transistor Tr6 is turned OFF while the transistor Tr5 is turned ON. A drain voltage ($V_{dmtr}$) of the memory transistor 104 is input to the input terminal 1 of the sense amplifier circuit 123 while a reference voltage $V_{ref(f)}$ is input to the input terminal 2. Then, electrical read is performed on the memory transistor 104, and read data (called data 2, hereinafter) is stored in the data latch group 132. The data 1 and data 2 (not shown in FIG. 3), which are stored in the data latch group 132 are compared in a verify circuit 134. When the data 1 and the data 2 are different pieces of information, electrical write is performed on the memory transistor 104 again. Then, electrical read is performed again on the memory cell 100 by using the sense amplifier circuit 123. This operation is repeated until the data 1 and the data 2 are recognized as the same information.

Next, electrical write (verify write) performed on the reference memory cell 107 will be described.

In order to perform electrical write on the reference memory cell 107, the transistors Tr2, Tr4 and Tr6 are all turned on while the other transistors are turned off. As shown in FIG. 3, the drain region of the reference memory transistor 108 included in the reference memory cell 107 is connected to the input terminal 2 of the sense amplifier circuit 123. The drain voltage ($V_{drtr}$) of the reference memory transistor 108 is input to the input terminal 2 of the sense amplifier circuit 123. The drain voltage ($V_{drtr}$) corresponding to the reference voltage $V_{ref(d)}$ is input to the input terminal 1.

Either High or Low signals are output from the output terminal of the sense amplifier circuit 123. When High signals are output from the output terminal of the sense amplifier circuit 123, a voltage is applied to the control gate (CG) of the reference memory transistor 108. Then, electrical write is performed again. Then, the drain voltage ($V_{drtr}$) of the reference memory transistor 108 is input to the input terminal 2 of the sense amplifier circuit 123. This operation is repeated until Low signals are output from the output terminal of the sense amplifier circuit 123. Then, electrical write is performed on the reference memory transistor 108.

This embodiment can be combined with the first embodiment freely.

EXAMPLES

First Example

An example of a detail construction of a circuit, which is used for electrical read by using a reference voltage generated from the reference memory cells 107 will be described here with reference to FIGS. 4A and 4B. First of all, a circuit shown in FIG. 4A and the operation will be described. Then, a circuit shown in FIG. 4B and the operation will be described.

Figure 4A:
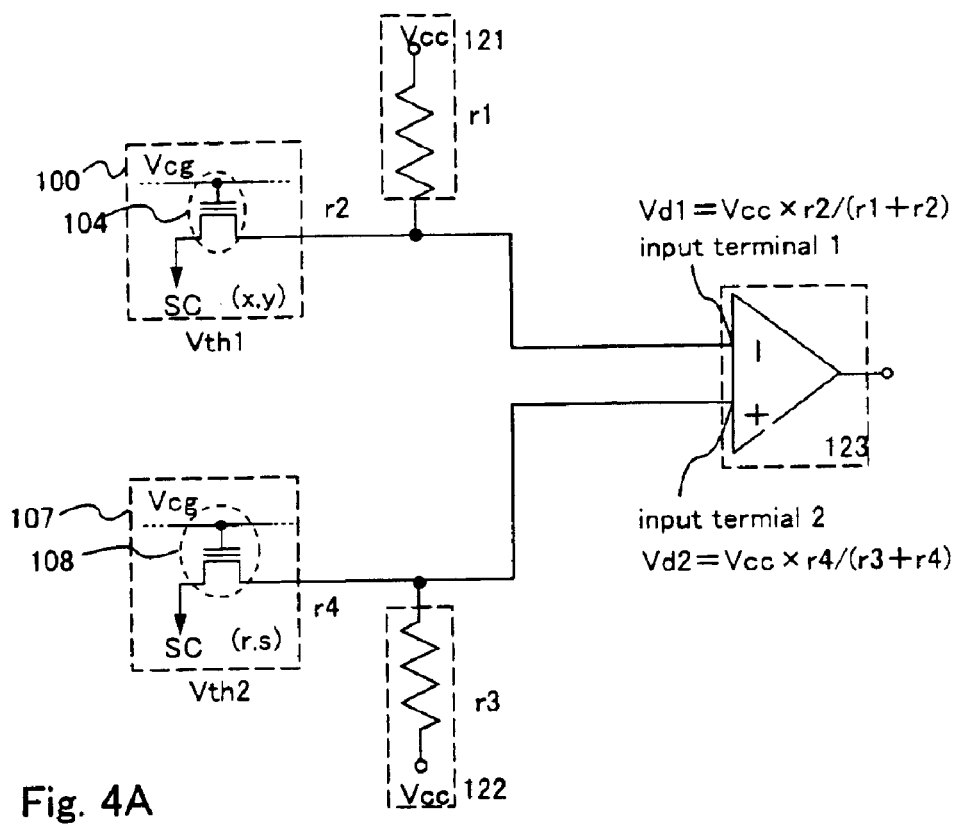
FIGS. 4A and 4B are explanatory diagrams of the read circuit of a nonvolatile memory according to the present invention.
Figure 4B:
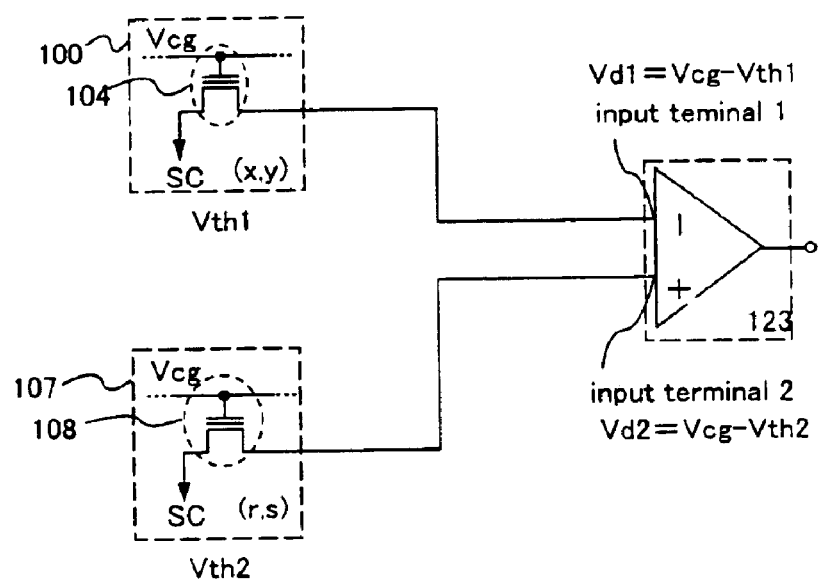

FIG. 4A shows a case where the memory cell 100 provided at a coordinate (x, y) and the reference memory cell 107 provided at a coordinate (r, s) are electrically connected to the sense amplifier circuit 123. Either of the source regions and the drain regions of the memory transistor 104 and the reference memory transistor 108, respectively, are connected to the common electrode (SC) and the other are connected to terminals of the resistance 121 and 122, respectively. A voltage ($V_{cc}$) is supplied to the other terminal of the resistances 121 and 122.

Following equations [1] and [2] are satisfied where $V_{d1}$ is a voltage input to the input terminal 1 of the sense amplifier circuit 123 and $V_{d2}$ is a voltage input to the input terminal 2 of the sense amplifier circuit 123. Notably, $r_1$ is a resistance value of the resistance 121, while $r_3$ is a resistance value of the resistance 122. $r_2$ is an effective resistance value of the memory transistor 104, while $r_4$ is an effective resistance value of the reference memory transistor 108.

$$V_{d1} = V_{cc} \times r_2/(r_1 + r_2) \quad [1]$$

$$V_{d2} = V_{cc} \times r_4/(r_3 + r_4) \quad [2]$$

Here, $V_{th1}$ is a threshold voltage of the memory transistor 104 while $V_{th2}$ is a threshold voltage of the reference memory transistor 108. Then, when $V_{th1} > V_{th2}$, $r_2 > r_4$. Similarly, when $V_{th1} < V_{th2}$, $r_2 < r_4$.

By substituting them into equations [1] and [2], when $V_{th1} > V_{th2}$, $V_{d1} > V_{d2}$, and when $V_{th1} > V_{th2}$, $V_{d1} < V_{d2}$. In other words, by comparing $V_{d1}$ and $V_{d2}$, in the sense amplifier circuit 123, the threshold voltage ($V_{th1}$) of the memory transistor 104 and the threshold voltage ($V_{th2}$) of the reference memory transistor 108 can be compared. As a result, the threshold voltage ($V_{th1}$) of the memory transistor 104 can be read.

Next, a circuit shown in FIG. 4B will be described. As shown in FIG. 4B, either of the source regions and the drain regions of the memory transistor 104 and the reference memory transistor 108, respectively, are connected to the common electrode (SC) and the other are connected to the input terminals 1 and 2 of the sense amplifier circuit 123, respectively. Following equations [3] and [4] are satisfied where $V_{d1}$ is a voltage input to the input terminal 1 and $V_{d2}$ is a voltage input to the input terminal 2.

$$V_{d1} = V_{cg} - V_{th1} \quad [3]$$

$$V_{d2} = V_{cg} - V_{th2} \quad [4]$$

In addition, a voltage ($V_{ss}$) to be input to the common electrode (SC) must satisfy following equations [5] and [6].

$$V_{ss} > V_{cg} - V_{th1} \quad [5]$$

$$V_{ss} > V_{cg} - V_{th2} \quad [6]$$

Based on the equations [5] and [6], when $V_{th1} > V_{th2}$, $V_{d1} < V_{d2}$, and when $V_{th1} < V_{th2}$, $V_{d1} > V_{d2}$. In other words, by comparing $V_{d1}$ and $V_{d2}$ in the sense amplifier circuit 123, the threshold voltage ($V_{th1}$) of the memory transistor 104 and the threshold voltage ($V_{th2}$) of the reference memory transistor 108 can be compared. As a result, the threshold voltage ($V_{th1}$) of the memory transistor 104 can be read.

This example can be combined with the first and second as desired.

Second Example

In this example, a nonvolatile memory having the reference memory cell array 109 in which multiple reference memory cells 107 are provided will be described with reference to FIGS. 5A and 5B.

Figure 5A:
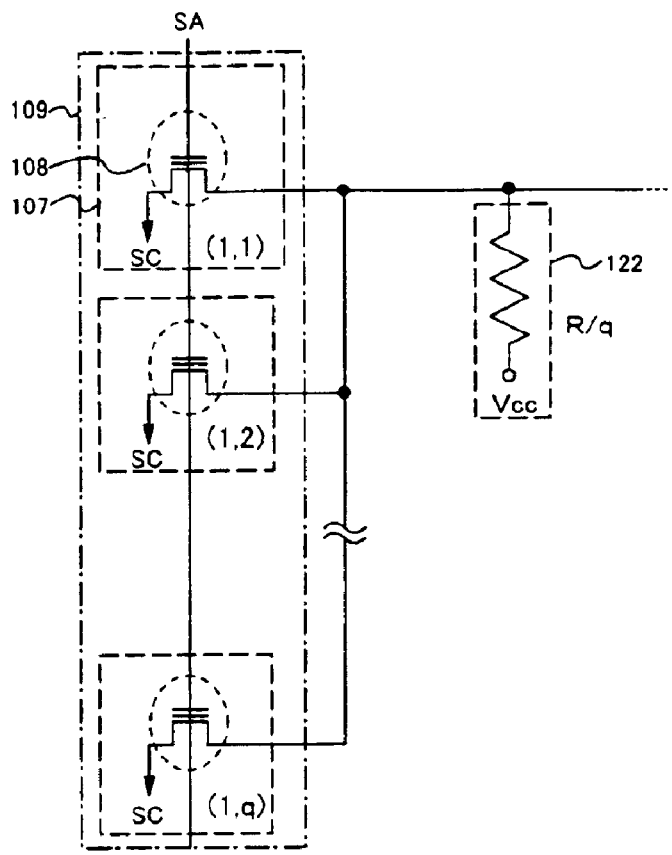
FIGS. 5A and 5B are explanatory diagrams of a read circuit of a nonvolatile memory according to the present invention.
Figure 5B:
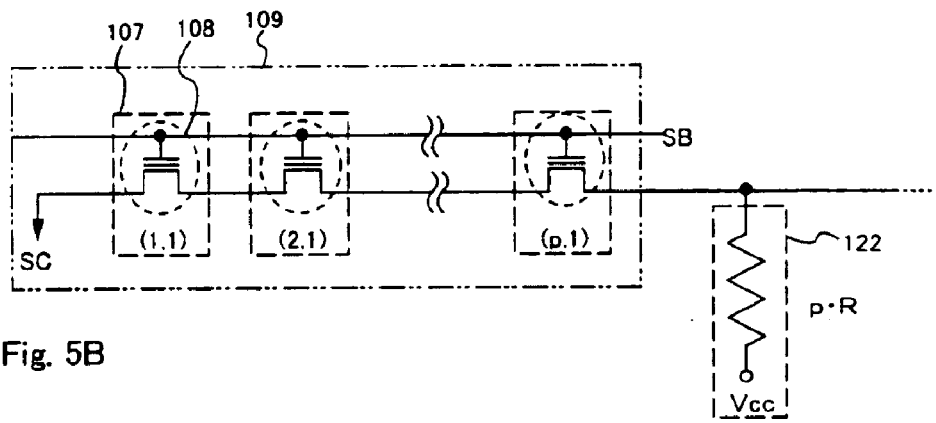

For simple description, a portion where the reference memory cell array 109 is connected to the resistance 122 is only shown in FIGS. 5A and 5B.

FIG. 5A shows the reference memory cell array 109 in which (1×q) reference memory cells 107 are arranged in parallel.

In FIG. 5A, each of the reference memory cells 107 has a reference memory transistor 108. Either the source region or the drain region of the reference memory transistor 108 is connected to a common electrode (SC) and the other is connected to the resistance 122. The gate electrodes of the reference memory transistors 108 included in the reference memory cell array 109 are all common and are connected to a connection wire (SA).

The same voltage is applied to all of the gate electrodes of the multiple reference memory transistors 108 through the connection wire (SA) in FIG. 5A. Here, an effective resistance value of the resistance 122 is R, where one reference memory transistor 108 is connected to the resistance 122. In the circuit shown in FIG. 5A, q reference memory transistors 108 are provided. Thus, the effective resistance value of the resistance 122 is R/q.

FIG. 5B includes a reference memory cell array 109 to which (q×1) reference memory cells 107 are provided in series.

In FIG. 5B, each of the reference memory cells 107 has a reference memory transistor 108. One of the source region and the drain region of the reference memory transistor 108 provided at a coordinate (1, 1) is connected to a common electrode (SC). The other is connected to either the source region or the drain region of a reference memory transistor 108 provided in a coordinate (2, 1). Each of the source regions and each of the drain regions of the reference memory transistors 108 at coordinates (2, 1) to (p−1, 1) are connected to either the source region or the drain region of the adjacent reference memory transistor 108. Either the source region or the drain region of the reference memory transistor 108 at a coordinate (p, 1) is connected to the resistance 122. The other is connected to either the source region or the drain region of the adjacent reference memory transistor 108. The gate electrodes of the reference memory transistors 108 included in the reference memory cell array 109 are all common and are connected to a connection wire (SB).

The same voltage is applied to all of the gate electrodes of the multiple reference memory transistors 108 through the connection wire (SB) in FIG. 5B. Here, an effective resistance value of the resistance 122 is R, where one reference memory cell 107 is connected to the resistance 122. In the circuit shown in FIG. 5B, p reference memory transistors 108 are provided. Thus, the effective resistance value of the resistance 122 is (p×R).

While the examples that there are provided the reference memory cells 107 connected to the reference memory cell array 109 in series (FIG. 5A) and in parallel (FIG. 5B) are described, the present invention is not limited thereto. The reference memory cells 107 connected in series and the reference memory cells 107 connected in parallel may be combined. Alternatively, the reference memory cells 107, which generate the same reference voltage, may be provided in series or in parallel. In this case, even when one reference memory cell 107 is poor, the refresh operation can be performed normally by using the other reference memory cells 107.

If there are provided multiple reference memory cells 107 as shown in FIGS. 5A and 5B, electrical read can be performed by using an average value of the reference voltage generated from the multiple reference memory cells 107. Thus, an effect from the variation in the charge holding characteristic can be reduced. Further, the reliability for performing the refresh operation can be improved.

This example may be combined with the first and the second embodiments and the first example as desired.

Third Example

In this example, a nonvolatile memory including multiple sense amplifier circuits 123 and multiple reference memory cells 107 and the operation will be described with reference to FIG. 6.

Figure 6:
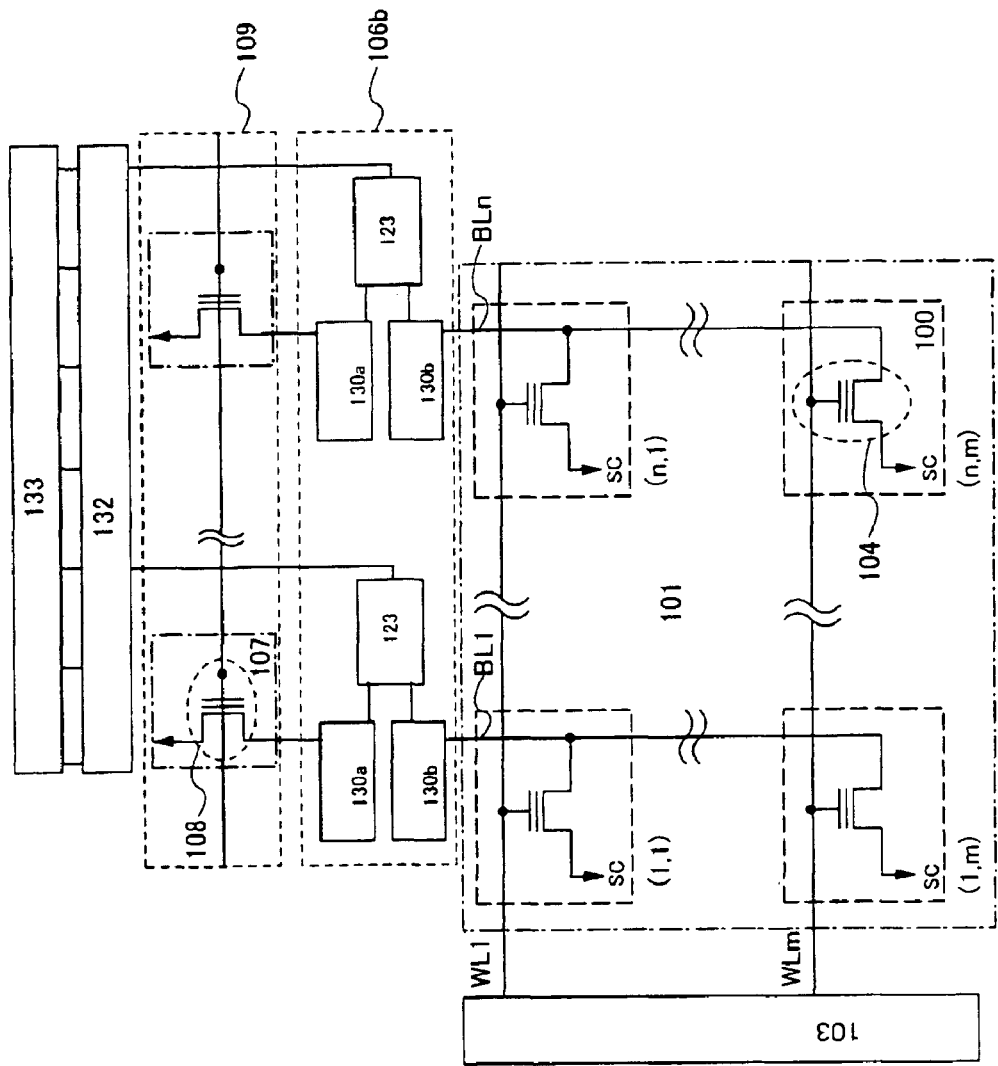
FIG. 6 shows a circuit diagram of the nonvolatile memory according to the present invention.

FIG. 6 shows a nonvolatile memory including multiple reference memory cells 107, multiple bias circuits 130a and 130b and multiple sense amplifier circuits 123. In practice, the other circuits such as a write/erase circuit 106a, and a verify circuit 134 are provided therein as shown in FIG. 1. However, they are omitted in FIG. 6.

One of the source region and the drain region of each of the reference memory cells 107, which are provided in parallel, is connected to the input terminal 1 of each of the sense amplifier circuits 123, and the other is connected to a common electrode (SC). One of the source region and the drain region of each of the memory transistors 104 is connected to the input terminal 2 of the sense amplifier circuit 123, and the other is connected to a common electrode (SC).

A drain voltage ($V_{dmtr}$) of the memory cell 100 is input to one of the input terminals 1 and 2 of the sense amplifier circuit 123. A drain voltage ($V_{drtr}$) of the reference memory cell 107 is input to the other input terminal. Multiple sense amplifier circuits 123 are provided in the read circuit 106b shown in FIG. 6. Thus, electrical read can be performed on the memory cells 100 for one line provided in the memory cell array 101 at the same time.

While one sense amplifier circuit 123 is provided in each column in the read circuit 106b shown in FIG. 6, the present invention is not limited thereto. For example, the memory cells 100 may be divided into an arbitrary number of groups. Then, the reference memory cell 107, the sense amplifier circuit 123 and the bias circuits 130a and 130b may be provided in each group.

This example can be combined with the first and the second embodiments 1 and 2 and the first and the second examples as desired.

Fourth Example

In this example, a NAND type EEPROM including a memory cell array in which multiple unit cells each including eight memory cells are arranged in the matrix manner will be described with reference to FIGS. 7 to 10.

Figure 7:
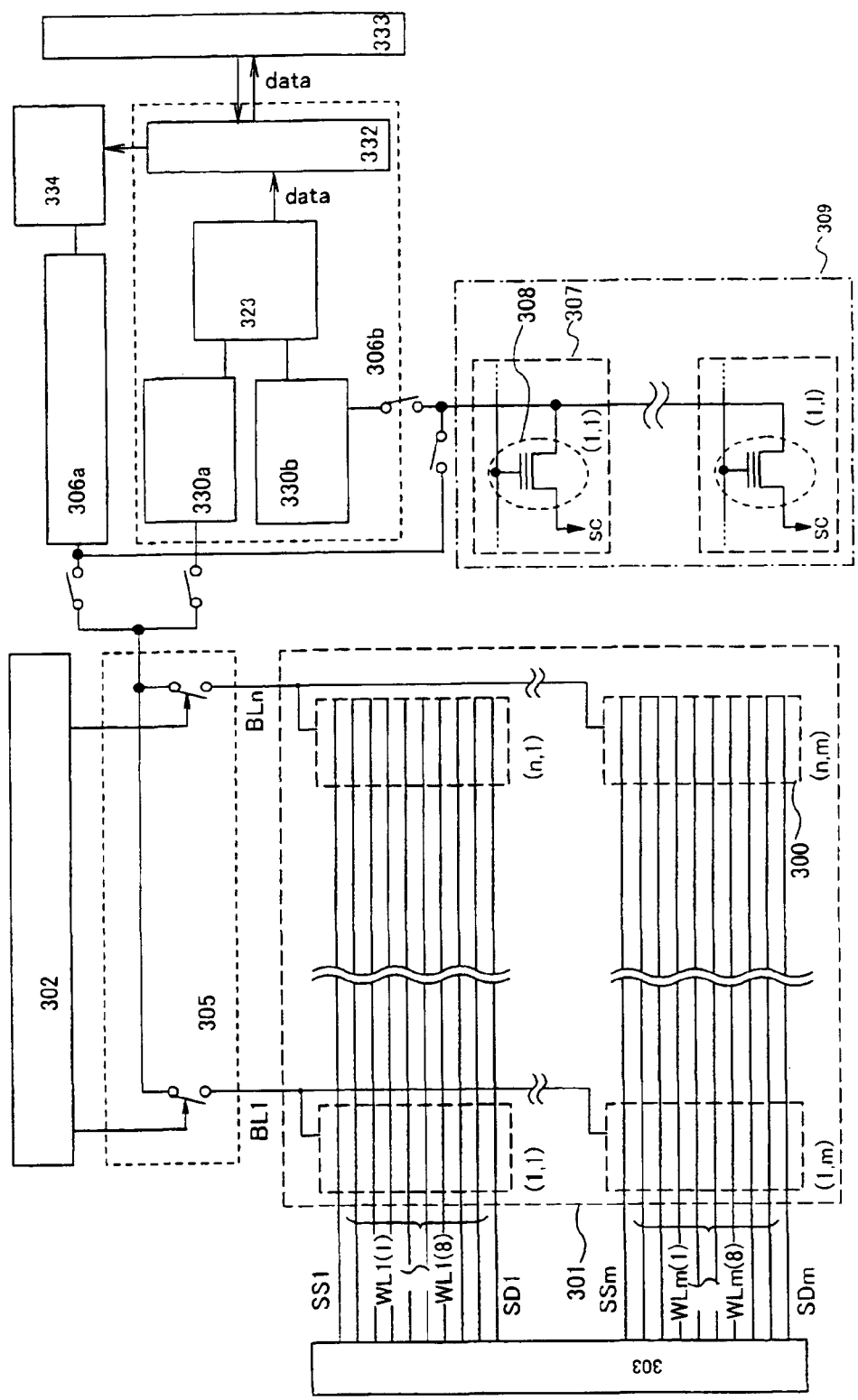
FIG. 7 shows a circuit diagram of a NAND type EEPROM.

First of all, an outline of the construction of the NAND type EEPROM will be described with reference to FIG. 7. A memory cell array 301 in the NAND type EEPROM is shown in FIG. 7. The memory cell array 301 has (n×m) unit cells 300 arranged in the matrix form (where n and m are natural numbers), (m×8) word lines ([WLl(1) to WLl(8)] to [WLm(1) to WLm(8)], m select gate lines (SS1 to SSm), and m select gate lines (SD1 to SDm), and n bit lines (BL1 to BLn).

The unit cell 300 includes eight memory transistors [MTr1(x, y) to MTr8(x, y)], and two select transistors [STr1(x, y) and STr2(x, y)] connected in series. (x, y) indicates a coordinate herein, where $1 \leq x \leq n$ and $1 \leq y \leq m$ (x and y are natural numbers).

In FIG. 7, each of control gates (CG) 11 of the memory transistors [MTr1 (x, y) to MTr8 (x, y)] is connected to any one of word lines ([WLl(1) to WLl(8)] to [WLm(1) to WLm(8)]). One of each of the source regions and each of the drain regions of the memory transistors [MTr1 (x, y) to MTr8 (x, y)] is connected to any one of bit lines (BL1 to BLn), and the other is connected to a common electrode (SC).

A word line side drive circuit 303, a Y-address decoder 302, a multiplexer 305, a write/erase circuit 306a, a read circuit 306b, a verify circuit 334 and a buffer 333 are provided around the memory cell array 301. The read circuit 306b has a bias circuit 330a, a bias circuit 330b, a sense amplifier circuit 323 and a data latch group 332. The bias circuit 330a is connected to an arbitrary unit cell 300 through a multiplexer 305. The bias circuit 330b is connected to an arbitrary reference memory cell 307 provided in the reference memory cell array 309. While only (1×1) reference memory cells 307 are provided in the reference memory cell array 309 shown in FIG. 7, the present invention is limited thereto. Any number of reference memory cells 307 may be provided in the reference memory cell array 309. However, at least (k−1) reference memory cells 307 must be provided in the k level nonvolatile memory.

Figure 8A:
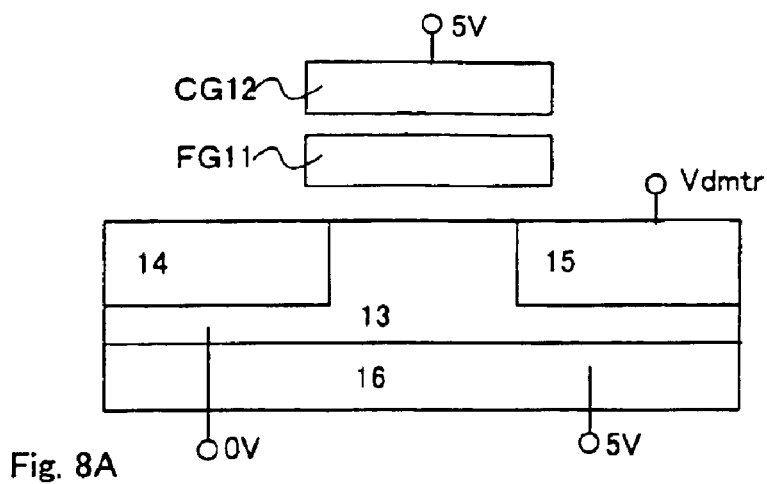
FIGS. 8A to 8C show sectional views of a construction of a memory transistor of the NAND type of EEPROM.
Figure 8B:
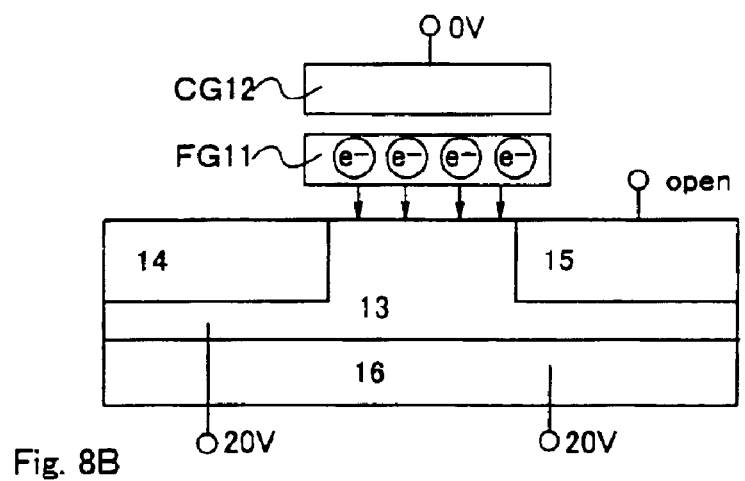
Figure 8C:
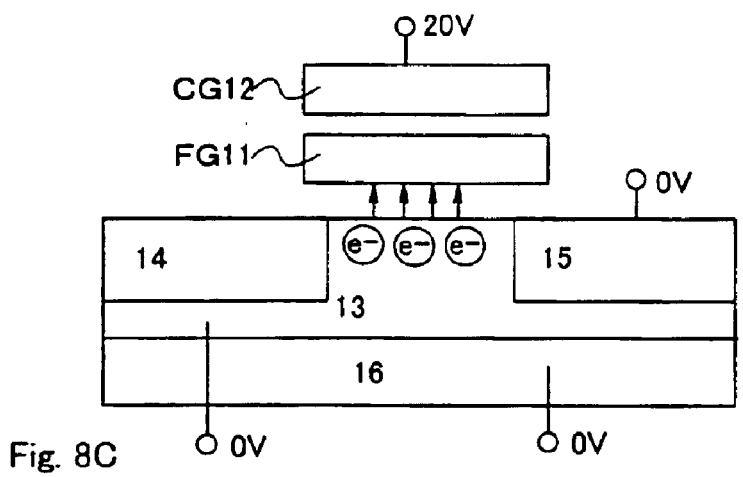

Next, a sectional construction of the memory transistors [MTr1 (x, y) to MTr8 (x, y)] will be described with reference to FIGS. 8A to 8C. Each of FIGS. 8A to 8C includes a floating gate (FG) 11, a control gate (CG) 12, a P⁻well 13, a source region (S) 14, and a drain region (D) 15, and an N⁻ substrate 16. The P⁻well 13 and the N⁻substrate 16 are silicon substrates to which impurity elements are added and given different conductive types, respectively. FIG. 8A shows a sectional construction of one of memory transistors [MTr1 (x, y) to MTr8 (x, y)] for performing electrical read. FIG. 8B shows a sectional construction of one of memory transistors [MTr1 (x, y) to MTr8 (x, y)] for performing electrical erase. FIG. 8C shows a sectional construction of one of memory transistors [MTr1 (x, y) to MTr8 (x, y)] for performing electrical write.

Now, operations of electrical read, electrical erase and electrical write by the NAND type EEPROM will be described. In this example, a binary NAND type EEPROM will be described for simple description. However the present invention is not limited thereto and may be applied to the multi-valued NAND type EEPROM. Here, it is assumed that the binary NAND type EEPROM has information "1" when threshold voltages of the memory transistors [MTr1 (x, y) to MTr8 (x, y)] are 0.5 V or above and 4.5 V or below. Further, it is assumed that the binary NAND type EEPROM has information "0" when threshold voltages of the memory transistors [MTr1 (x, y) to MTr8 (x, y)] are 5.5 V or above and 7.0 V or below. The threshold voltage having information "0" is indicated by $V_{t("0")}$ and the threshold voltage having information "1" is indicated by $V_{t("1")}$. In this case, the $V_{t("0")}$ and $V_{t("1")}$ satisfy following equations [7] and [8]

$$0.5 \ V \leq V_{t("1")} \leq 4.5 \ V \quad [7]$$

$$5.5 \ V \leq V_{t("0")} \leq 7.0 \ V \quad [8]$$

First of all, electrical read performed on the NAND type EEPROM will be described with reference to FIG. 9A. FIG.

9A shows a unit cell 300 located at (x, y). In this example, The MTr7 (x, y) is selected to perform electrical read of information that the memory transistor MTr7 (x, y) includes. Notably, the sectional construction of the memory transistor MTr7 (x, y) for performing electrical read is shown in FIG. 8A for reference.

A voltage (5.0 V in this example) is applied to a gate electrode of the selected memory transistor MTr7 (x, y). A voltage (8.0 V in this example) is applied to a gate electrode of the other (unselected) memory transistor MTr1 (x, y) to MTr6 (x, y) and MTr8 (x, y). According to the equations [7] and [8], applying the voltage of 8.0 V brings the memory transistor MTr1 (x, y) to MTr6 (x, y) and MTr8 (x, y) into conduction.

Under this state, a drain voltage ($V_{dmtr}$) of the selected memory transistor MTr7 (x, y) is input to an input terminal 1 of the sense amplifier circuit 323 through the bias circuit 330a. A drain voltage ($V_{drtr}$) of the reference memory transistor 308 provided in a coordinate (r, s) is input to an input terminal 2 of the sense amplifier circuit 323. Then, either High or Low signals are output from an output terminal of the sense amplifier circuit 323.

In this example, a reference voltage $V_{ref(e)}$ is generated from the reference memory cell 307 provided in a coordinate (r, s).

Then, a drain voltage ($V_{dmtr}$) of the memory transistor MTr7 (x, y) is input to the input terminal 1 of the sense amplifier circuit 323. A drain voltage (a voltage corresponding to the reference voltage $V_{ref(e)}$) of the reference memory transistor 308 provided in a coordinate (r, s) is input to the input terminal 2 of the sense amplifier circuit 323. Then, either High or Low signals are output from the output terminal of the sense amplifier circuit 323. Then, the High or Low signals output from the output terminal of the sense amplifier circuit 323 are stored in the data latch group 332.

In this example, when signals output from the sense amplifier circuit 323 are High signals, the memory transistor MTr7 (x, y) is determined as having information "0". When signals output from the sense amplifier circuit 323 are Low signals, the memory transistor MTr7 (x, y) is determined as having information "1". In this way, the electrical read is performed.

Next, electrical erase performed on the NAND type EEPROM will be described with reference to FIG. 9B. Notably, the sectional construction of the memory transistors [MTr1 (x, y) to MTr8 (x, y)] for performing electrical erase is shown in FIG. 8B for reference.

In this example, a case where information included in the memory cell array 301 of the NAND type EEPROM is electrically erased by one operation will be described. In other words, information included in all memory transistors [MTr1 (x, y) to MTr8 (x, y)] is electrically erased by one operation.

Notably, a term "electrical erase" refers to a state where charges accumulated in the floating gates 11 of all of the memory transistors [Mtr1 (x, y) to MTr8 (x, y)] are removed and the threshold voltage of all of the memory transistors [Mtr1 (x, y) to MTr8 (x, y)] is 4.5 V or below to achieve the state "1".

First of all, Voltages of 20 V are applied to the P⁻well 13 and the N⁻substrate 16, respectively. Voltages of 0 V are applied to the word lines [WLy (1) to WLy (8)]. Voltages of 0 V are applied to the control gates 12 of the memory transistors [MTr1 (x, y) to MTr8 (x, y)]. Under this condition, electrons accumulated in the floating gate 11 are released toward the P⁻well 13. As a result, the threshold voltages of all of the memory transistors can be 4.5 V or below. In this way, the electrical erase can be performed.

Figure 10:
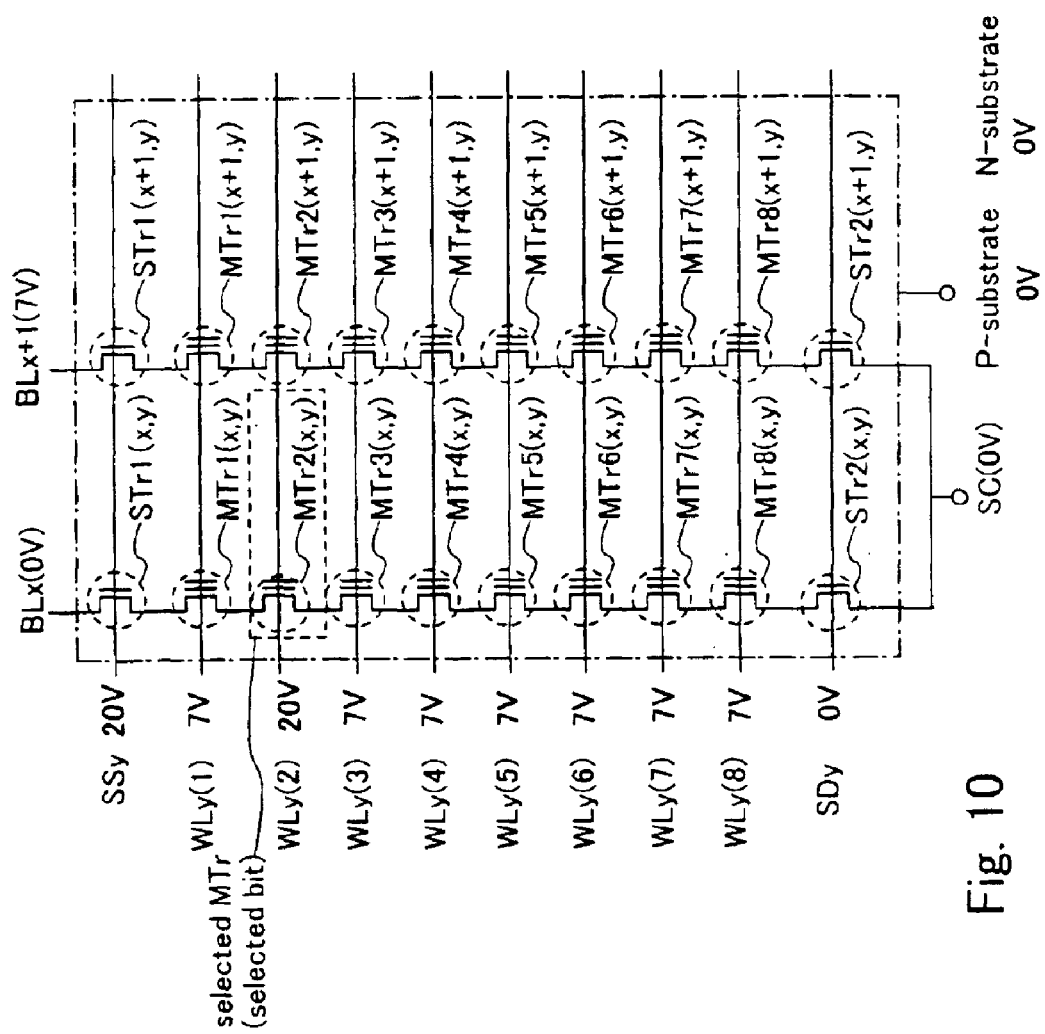
FIG. 10 is a diagram showing a unit cell of a NAND type EEPROM.

Next, electrical write performed on the NAND type EEPROM will be described with reference to FIG. 10. Notably, the sectional construction of the memory transistors [MTr1 (x, y) to MTr8 (x, y)] for performing electrical write is shown in FIG. 8C for reference.

In this example, a word line [WLy(2)] is selected for performing electrical write of information "0" in the memory transistor MTr2 (x, y). The electrical write is performed on the memory transistors [MTr2 (1, y) to MTr2 (n, y)], which are connected to the selected word line [WLy (2)] at the same time.

First of all, voltages of 0 (zero) V are applied to the P⁻well 13, the N⁻substrate 16, and the bit line (BLx). Then, a high voltage of 20V is applied to the selected word line [WLy(2)]. A voltage (in this example, 7.0 V) is applied to the unselected word lines WLy (1) and [WLy (3)] to [WLy (8)].

Since electrical write of the information "0" is performed on the selected memory transistor MTr2 (x, y), the threshold voltage of the memory transistor MTr2 (x, y) must be within a range of 5.5 V to 7.0 V. Since electrical erase is performed on the memory transistor MTr2 (x, y), the threshold voltage of the memory transistor MTr2 (x, y) is 4.5 V or below. Therefore, electrons must be implanted to the floating gates 12.

A voltage of 0 V is applied to the bit line (BLx), and a high voltage of 20V is applied to the select gate signal line (SSy). Further, a voltage of 0 V is applied to the select gate signal line (SDy).

Under this condition, a voltage of 20 V is applied to between the control gate 12 and the P⁻well 13 in the memory transistor MTr2 (x, y), and electrons can be implanted to the floating gate 11 from the P⁻substrate 13.

On the other hand, information "1" is written in the memory transistor MTr2 (x+1, y) connected to the bit line [BL(x+1)]. Then, when electrical erase is performed thereon, the threshold voltages of all memory transistors are 4.5 V or below. Thus, no changes occurring in the state means writing information "1".

However, the high voltage of 20 V is applied to the word line (WLy (2)). Therefore, a certain potential (7.0 V in this example) is applied to the bit line [BL(x+1)] so as to prevent electrons from being implanted from the P⁻well 13 to the floating gate 11.

By performing operations as described above, information "1" can be written in the memory transistor MTr2 (x+1, y).

Next, a case where the refresh operation of the present invention is applied to a NAND type EEPROM will be described with reference to FIG. 7. The memory transistors [MTr1 (x, y) to MTr8 (x, y)] and the reference memory transistor 308 have the same characteristics.

According to the present invention, the refresh operation is an operation combining electrical write performed on memory cells and electrical write performed on the reference memory cell. First of all, the electrical write performed on memory cells will be described. In this example, a case will be described where electrical write is performed on the memory transistor MTr7 (x, y) having information "k" by using the reference voltages $V_{ref(e)}$ and $V_{ref(f)}$.

As shown in FIG. 7, the drain region of the memory transistor MTr7 (x, y) included in the unit cell 300 is connected to the input terminal 1 of the sense amplifier circuit 323. In other words, a drain voltage ($V_{dmtr}$) of the memory transistor MTr7 (x, y) is input to the input terminal 1 of the sense amplifier circuit 323. Further, either reference voltage $V_{ref(e)}$ or $V_{ref(f)}$ is input to the input terminal 2 of the sense amplifier circuit 323. First, the reference voltage $V_{ref(e)}$ is input to the input terminal 2 of the sense amplifier circuit 323. Then, electrical read is performed on the memory transistor MTr7 (x, y), and the read data (called "data 1" hereinafter) is stored in the data latch group 132.

Next, the drain voltage ($V_{dmtr}$) of the memory transistor MTr7 (x, y) is input to the input terminal 1 of the sense amplifier circuit 323 while the reference voltage $V_{ref(f)}$ is input to the input terminal 2. Then, electrical read is performed on the memory transistor MTr7 (x, y), and the read data (called "data 2" hereinafter) is stored in the data latch group 132. If information of data 1 and the information of the data 2 are different here, a voltage is applied to the memory transistor MTr7 (x, y). Then, electrical write is performed on the memory transistor MTr7 (x, y) again. Then, electrical read is performed on the memory transistor MTr7 (x, y) by using the sense amplifier circuit 323 until the information of the data 1 and the information of the data 2 are realized as the same information.

Next, electrical write performed on the reference memory cell 307 will be described with reference to FIG. 7. In this example, a case will be described where electrical write is performed on the reference memory cell 307 having information "k" by using reference voltages $V_{ref(e)}$ and $V_{ref(f)}$.

As shown in FIG. 7, the drain region of the reference memory transistor 308 included in the reference memory cell 307 is connected to the input terminal 2 of the sense amplifier circuit 323. A drain voltage ($V_{drtr}$) of the reference memory transistor 308 is input to the input terminal 2 of the sense amplifier circuit 323, and the reference voltage $V_{ref(f)}$ is input to the input terminal 1.

High or Low signals are output from the output terminal of the sense amplifier circuit 323. When the High signals are output from the output terminal of the sense amplifier circuit 323, a voltage is applied to the control gate (CG) of the reference memory transistor 308 to perform electrical write thereon. Then, the drain voltage ($V_{drtr}$) of the reference memory transistor 308 is input to the input terminal 2 of the sense amplifier circuit 323 again. In this way, the operation is repeated until Low signals are output from the output terminal of the sense amplifier circuit 323. Then, electrical write is performed on the reference memory transistor 308.

This example can be combined with the first and the second embodiments and the first to third examples.

Fifth Example

The nonvolatile memory to which the present invention is applied can be used for various applications. For example, it may be used as a memory medium built in a personal computer, for example. Alternatively, it may be used as a memory medium built in a memory card. In this example, a nonvolatile memory to which a timer and a battery are provided will be described with reference to FIG. 11.

Figure 11:
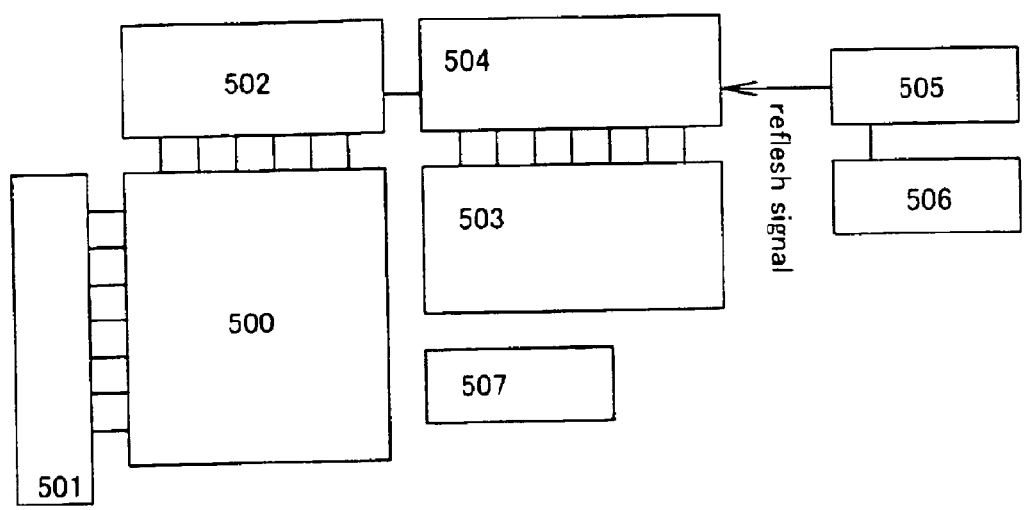
FIG. 11 is a block diagram of the nonvolatile memory according to the present invention.

FIG. 11 schematically shows a construction of the nonvolatile memory of the present invention. FIG. 11 includes a memory cell array 500, a word line side drive circuit 501 and a bit line side drive circuit 502. The word line side drive circuit 501 and the bit line side drive circuit 502 control the memory cell array 500. Further, FIG. 11 includes a reference memory cell array 503 and a write/read/erase circuit 504. The write/read/erase circuit 504 controls the reference memory cell array 503. The memory cell array 500 includes multiple memory cells. The reference memory cell array 503 includes at least (k−1) reference memory cells.

Furthermore, FIG. 11 includes a timer 505 and a battery 506. The battery 506 is used as a battery used to back up the timer 505.

When the timer 505 and the battery 506 are provided in the nonvolatile memory, the timer 505 may be used to measure a time passed since the last refresh operation. Then, the refresh operation may be performed after each lapse of a predetermined time. In this case, refresh signals may be output from the timer 505 to the write/read/erase circuit 504 to perform the refresh operation on the memory cell array 500. Alternatively, the refresh operation may be set such that it can be performed automatically when the power supply 507 is turned ON or is turned OFF.

This example can be combined with the first and the second embodiments and the first to fourth examples as desired.

Sixth Example

The case where the memory transistor having the construction including the control gate 11, the floating gate 12, the source region 14 and the drain region 15 shown in FIG. 8 is used has been described above. However, the present invention can be applied to memory transistors having various constructions, respectively. In this example, a memory transistor having the other construction than the one shown in FIG. 8 will be described with reference to FIGS. 12A to 12C.

Figure 12A:
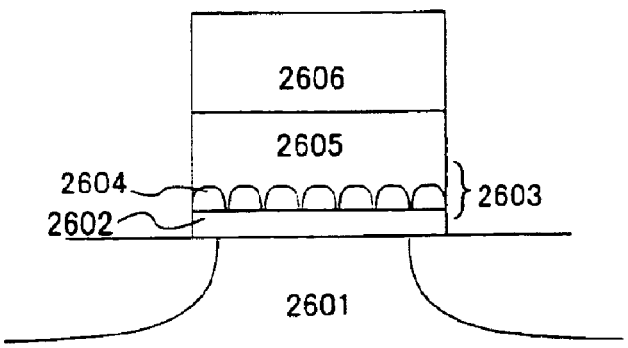
FIGS. 12A to 12C are sectional views of a construction of a memory transistor.

FIG. 12A shows an example of a sectional construction of a memory transistor having a cluster layer. The memory transistor has an active region 2601, a first insulating film 2602, a cluster layer 2603, a second insulating film 2605 and a control gate 2606. A typical memory transistor having a cluster layer is disclosed in Japanese Patent Laid-Open No. 49-22356.

The cluster layer 2603 includes multiple clusters 2604. Each of the clusters 2604 has a function of accumulating charges and includes discrete and massive semiconductor or conductor (metal).

Figure 12B:
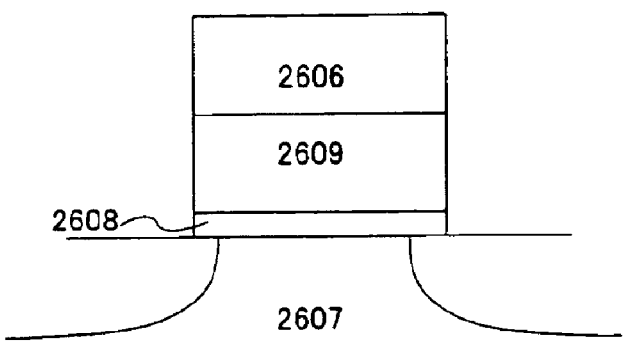
Figure 12C:
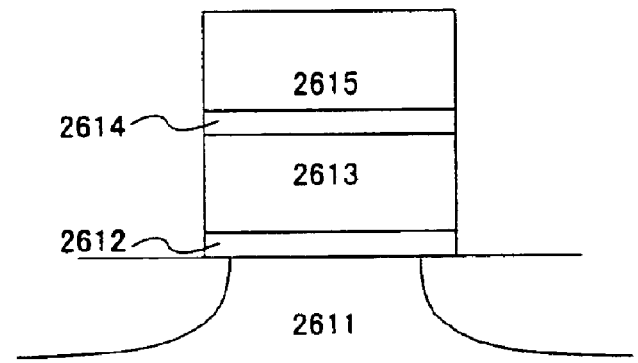
Figure 13:
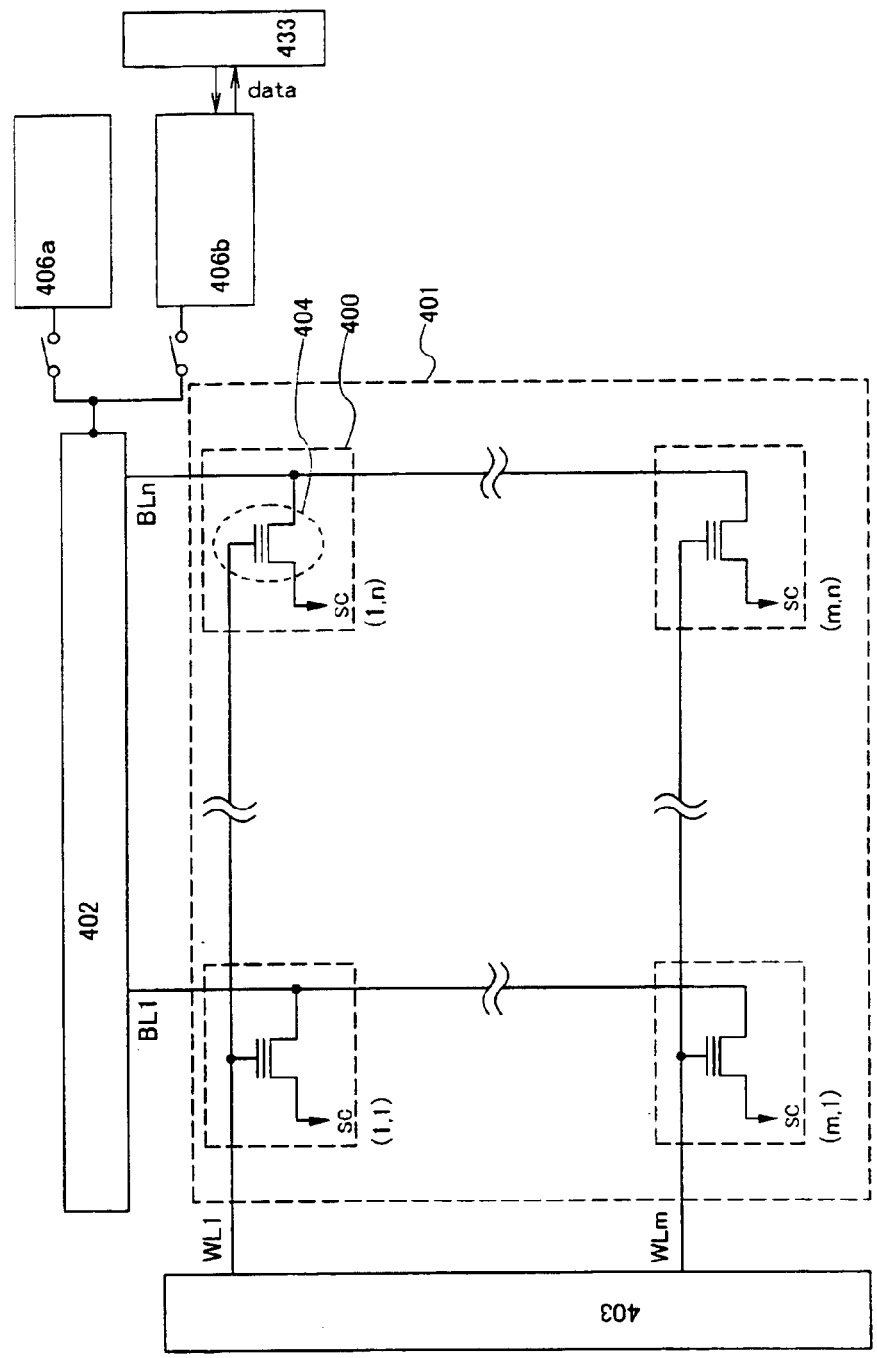
FIG. 13 is a circuit diagram of a nonvolatile memory of the related art.
Figure 14A:
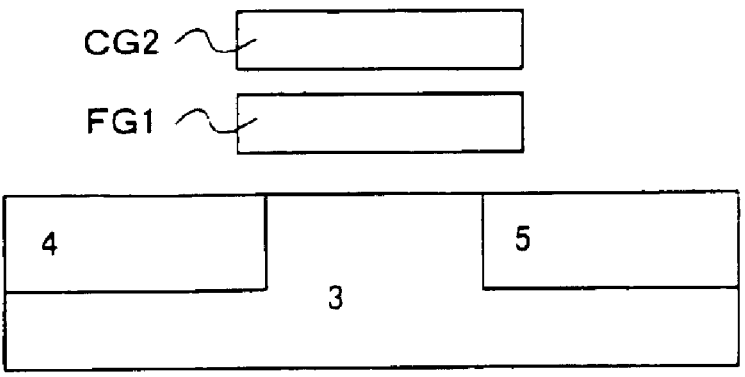
FIGS. 14A to 14C are sectional views of a construction of a memory transistor.
Figure 14B:
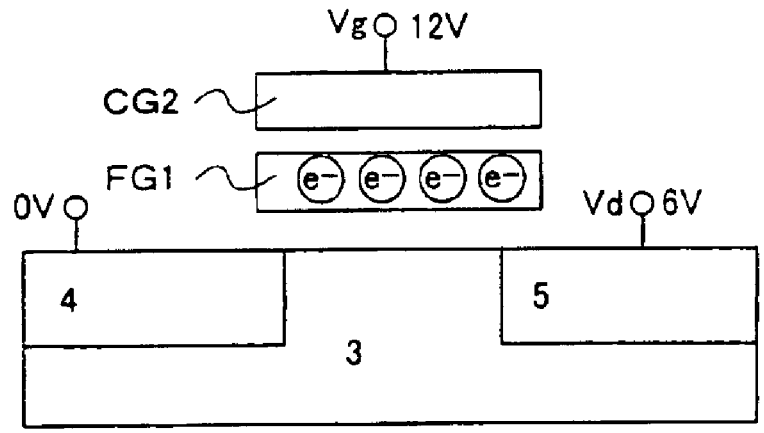
Figure 14C:
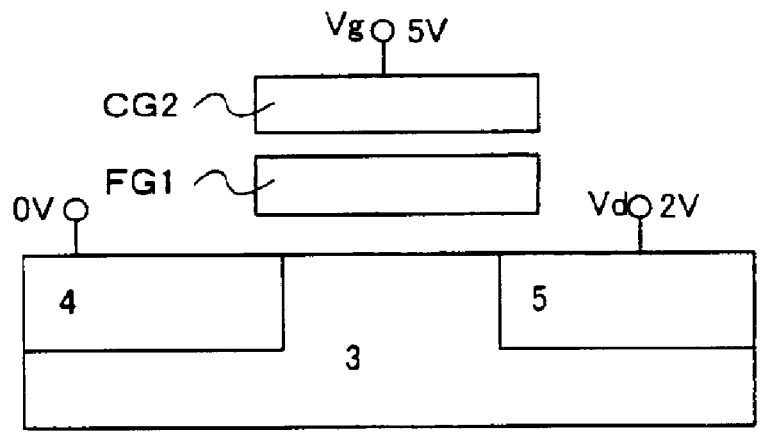
Figures 15A, 15B:
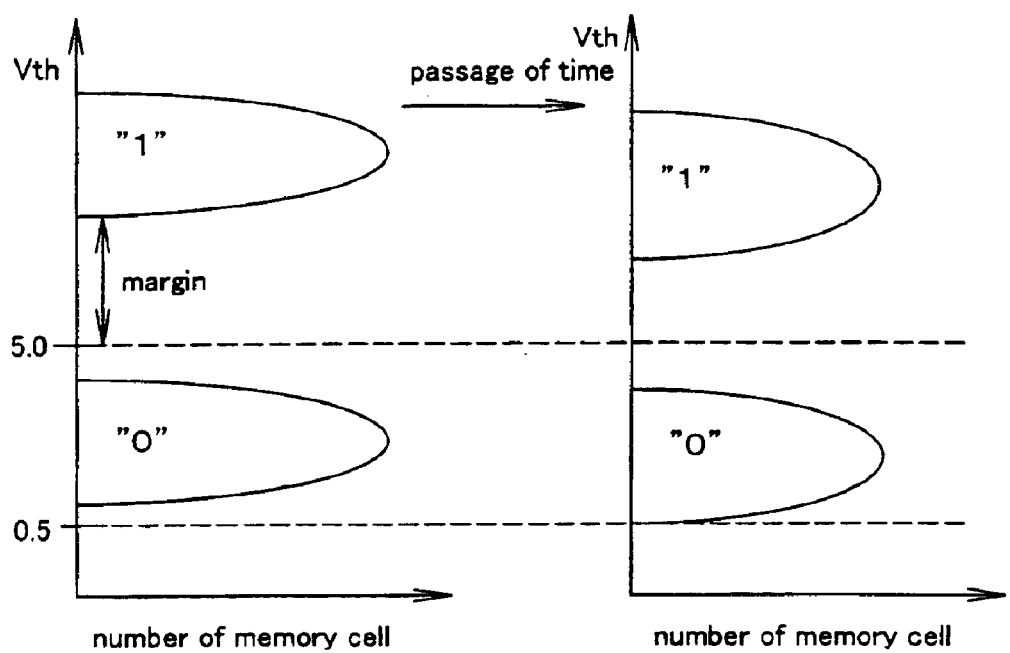
FIGS. 15A and 15B are explanatory diagrams of a shift phenomenon of a nonvolatile memory (binary memory)
Figures 16A, 16B:
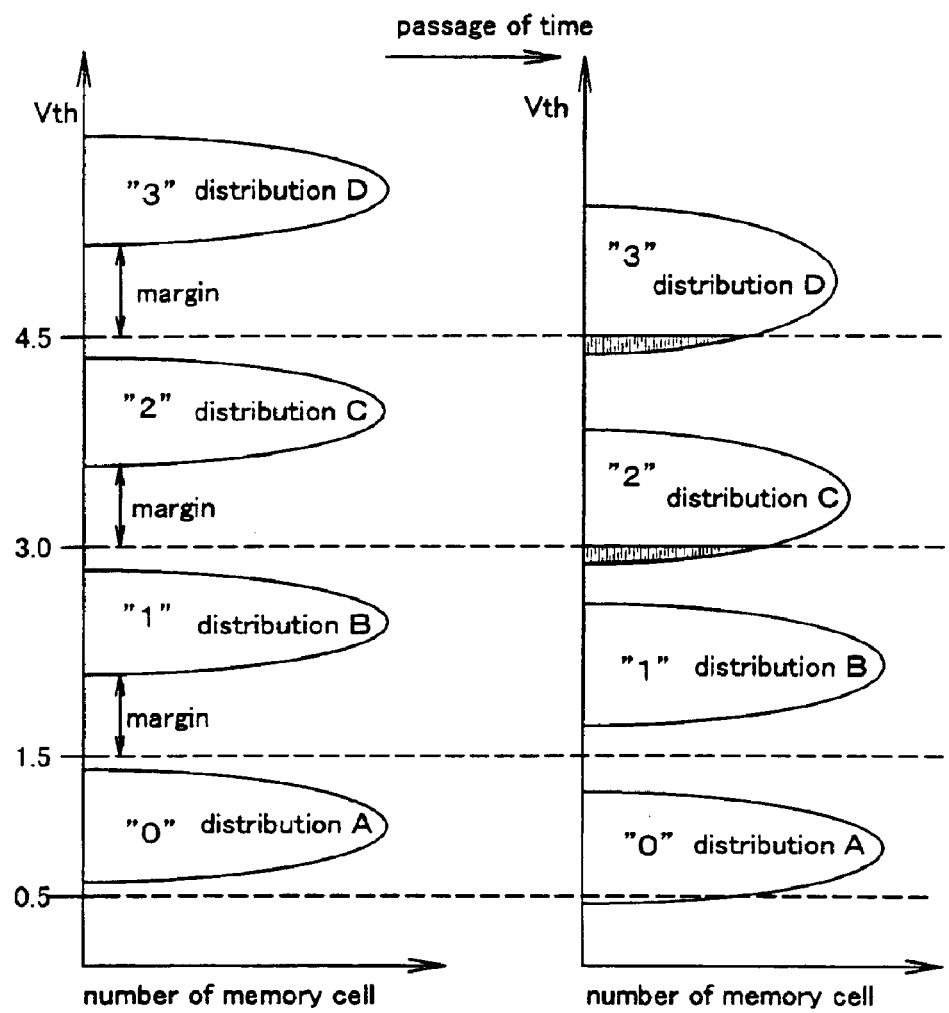
FIGS. 16A and 16B are explanatory diagrams of a shift phenomenon of a nonvolatile memory (quaternary memory)
Figure 17A:
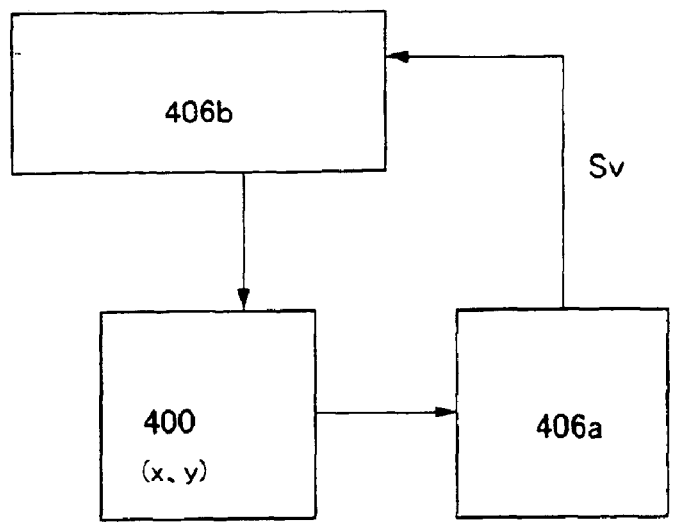
FIGS. 17A and 17B are explanatory diagrams of a verify operation.
Figure 17B:
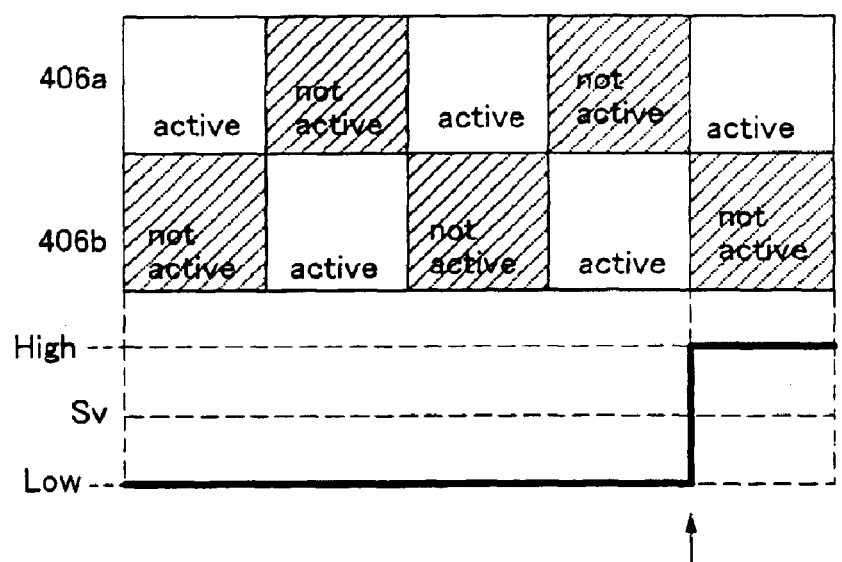

Each of FIGS. 12B and 12C shows a sectional construction of a memory transistor having a nitride film functioning as a region for accumulating charges. The memory transistor shown in FIG. 12B is of Metal Nitride Oxide Semiconductor (MNOS) type and has an active region 2607, an oxide film 2608, a nitride film 2609 and a control gate 2610. Notably, in this example, the oxide film 2608 is formed by a silicon oxide ($SiO_2$) film while the nitride film 2609 is formed by a silicon nitride ($Si_3N_4$) film.

The memory transistor shown in FIG. 12C is of Metal Oxide Nitride Oxide Semiconductor (MONOS) type and has an active region 2611, a first oxide film 2612, a nitride film 2613, a second oxide film 2614, and a control gate 2615. Notably, in this example, the first oxide film 2612 and the second oxide film 2614 are formed by silicon oxide ($SiO_2$) films while the nitride film 2613 is formed by a silicon nitride ($Si_3N_4$) film.

In two of the memory transistors above, the nitride film 2609 and the nitride film 2613 have a function of accumulating charges. Here, a discrete impurity level in the nitride film 2609 and the nitride film 2613 functions for accumulating charges.

The nitride films included in the MNOS type (FIG. 12B) and the MONOS type (FIG. 12C) of memory transistors are worse in charge holding characteristic than the other memory transistors. Thus, it is significantly effective that the refresh operation of the present invention is performed thereon.

This example can be combined with the first and the second embodiments and the first to the fifth examples as desired.

Seventh Example

Electronic apparatuses using the nonvolatile memory of the present invention as a memory medium include video cameras, digital cameras, the goggle type of displays (head-mount displays), navigation systems, sonic reproduction apparatuses (car audio products, audio components and so on), the notebook type of personal computers, game apparatuses, mobile information terminals (mobile computers, mobile telephones, mobile game machines, electronic books and so on), and image reconstruction device including a memory medium (more specifically, a device for playing a recording medium such as a digital versatile disk (DVD), which includes a display for displaying the reconstructed images). Specific examples of these electronic apparatuses are shown in FIGS. 18A to 18H, respectively.

Figure 18A:
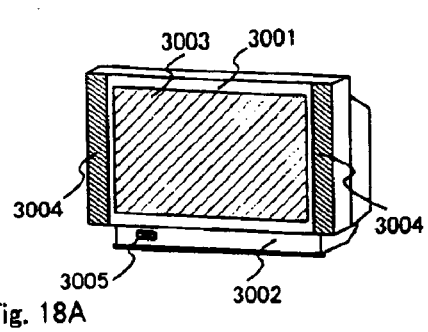
FIGS. 18A to 18H show electronic apparatuses to which the nonvolatile memory according to the present invention can be applied as a memory medium.

FIG. 18A is a light-emitting device and includes a cabinet 3001, a supporting base 3002, a display portion 3003, a speaker portion 3004 and a video input terminal 3005. The nonvolatile memory of the present invention is connected to the display portion 3003 or the other signal control circuit. The nonvolatile memory of the present invention is used as a memory medium for image signal correction and/or processing data.

Figure 18B:
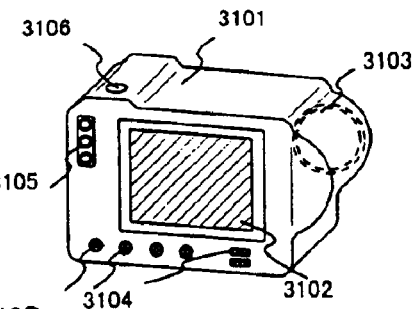

FIG. 18B shows a digital still camera and includes a body 3101, a display portion 3102, an image-receiving portion 3103, operation keys 3104, an external connecting port 3105 and a shutter 3106. The nonvolatile memory of the present invention may be incorporated in, for example, an LSI substrate built in a digital still camera, and may be used as a memory medium for image data.

Figure 18C:
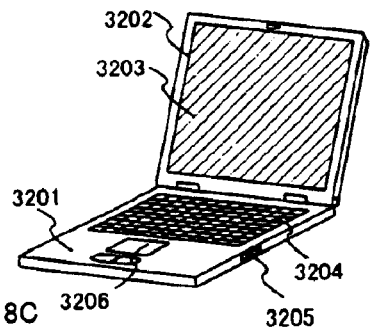

FIG. 18C shows a notebook type personal computer and includes a body 3201, a cabinet 3202, a display portion 3203, a keyboard 3204, an external connecting port 3205 and a pointing mouse 3206. The nonvolatile memory of the present invention may be incorporated in, for example, an LSI substrate built in a notebook type personal computer, and may be used as a memory medium for image data.

Figure 18D:
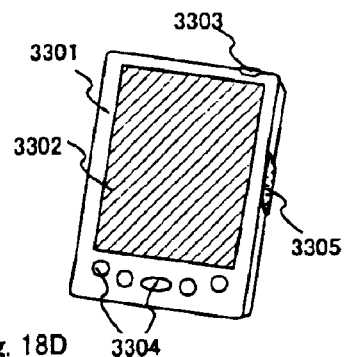

FIG. 18D shows a mobile computer and includes a body 3301, a display portion 3302, a switch 3303, operation keys 3304 and an infrared-ray port 3305. The nonvolatile memory of the present invention may be incorporated in, for example, an LSI substrate built in a mobile computer, and may be used as a memory medium for image data and/or processing data.

Figure 18E:
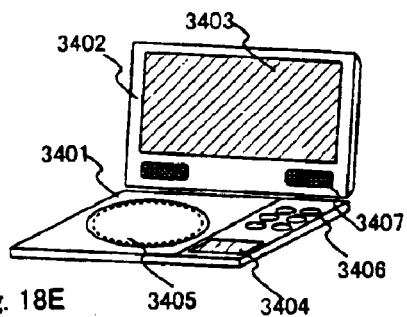

FIG. 18E shows a mobile image reconstruction apparatus (specifically, a DVD player) and includes a body 3401, a cabinet 3402, a display portion A 3403, a display portion B 3404, a memory medium (such as DVD) reading portion 3405, operation keys 3406 and a speaker portion 3407. The nonvolatile memory of the present invention may be incorporated in, for example, an LSI substrate built in a DVD player, and may be used as a memory medium for image data.

Figure 18F:
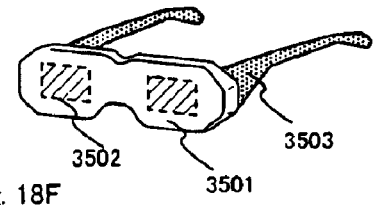

FIG. 18F shows a goggle type display (head-mount display) and includes a body 3501, a display portion 3502 and an arm portions 3503. The nonvolatile memory of the present invention may be incorporated in, for example, an LSI substrate built in a goggle type display, and may be used as a memory medium for image data.

Figure 18G:
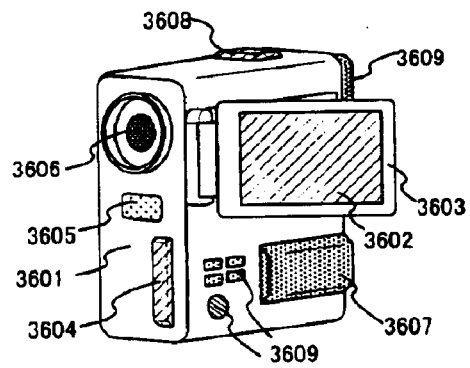

FIG. 18G shows a video camera and includes a body 3601, a display portion 3602, a cabinet 3603, an external connecting port 3604, a remote control receiving portion 3605, an image-receiving portion 3606, a battery 3607, a voice input portion 3608 and operation keys 3609. The nonvolatile memory of the present invention may be incorporated in, for example, an LSI substrate built in a video camera, and may be used as a memory medium for image data.

Figure 18H:
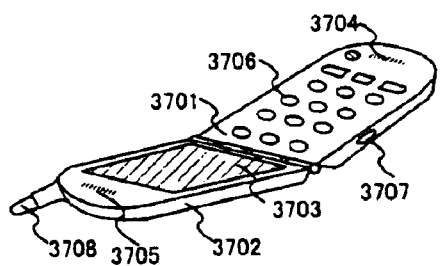

FIG. 18H shows a mobile telephone and includes a body 3701, a cabinet 3702, a display portion 3703, a voice input portion 3704, a voice output portion 3705, operation keys 3706, an external connecting port 3707 and an antenna 3708. The nonvolatile memory of the present invention may be incorporated in, for example, a substrate built in a mobile telephone, and may be used as a memory medium for storing telephone numbers.

As described above, the present invention can be applied in various ways and can be used as memory media for electronic apparatuses in various fields.

The nonvolatile memory according to the present invention can precisely read information included in a memory transistor subject to a shift phenomenon because electrical read is performed on the memory transistor by using a reference voltage generated from a refresh memory transistor.

Further, according to the present invention, the period of time during which the refresh operation is performed can be longer than before, which improves the reliability of information stored in the memory transistor. Furthermore, the margin between distributions of threshold voltages can be reduced, which improves the scale of integration of the multilevel nonvolatile memory.

What is claimed is:

1. A camera comprising:
   a display portion; and
   a nonvolatile memory, the nonvolatile memory comprising:
      a memory transistor;
      a reference memory transistor;
      a first circuit for electrically reading a threshold voltage of the memory transistor by using a threshold voltage of the reference memory transistor;
      a second circuit for performing electrical write on the memory transistor until the threshold voltage of the memory transistor is higher than a first reference voltage; and
      a third circuit for performing electrical write on the reference memory transistor until the threshold voltage of the reference memory transistor is higher than a second reference voltage.

2. A camera according to claim 1, wherein the first reference voltage is higher than the second reference voltage.

3. A camera according to claim 1, wherein the second reference voltage is higher than a threshold voltage of the reference memory transistor.

4. A camera according to claim 1, wherein each of the memory transistor and the reference memory transistor comprises an active region, a charge accumulating region, and a control gate, and the charge accumulating region is provided between the active region and the control gate and overlaps the control gate.

5. A camera according to claim 1, wherein each of the memory transistor and the reference memory transistor comprises an active region, a floating gate, and a control gate, and the floating gate is provided between the active region and the control gate and overlaps the control gate.

6. A camera according to claim 1, wherein each of the memory transistor and the reference memory transistor comprises an active region, a nitride film, and a control gate, and the nitride film is provided between the active region and the control gate and overlaps the control gate.

7. A camera according to claim 1, wherein each of the memory transistor and the reference memory transistor comprises an active region, a cluster layer, and a control gate, and the cluster is provided between the active region and the control gate and overlaps the control gate.

8. A camera according to claim 1, wherein the memory transistor and the reference memory transistor store multi-level information.

9. A camera comprising:
a display portion; and
a nonvolatile memory, the nonvolatile memory comprising:
a memory transistor;
a reference memory transistor;
a first circuit for performing electrical write on the memory transistor until a first threshold voltage of the memory transistor, which is read based on a reference voltage of the reference memory transistor, and a second threshold voltage of the memory transistor, which is read based on a first reference voltage of the reference memory transistor belong to a distribution of threshold voltages for same information; and
a second circuit for performing electrical write on the reference memory transistor until a threshold voltage of the reference memory transistor is higher than a second reference voltage.

10. A camera according to claim 9, wherein the first reference voltage is higher than the second reference voltage.

11. A camera according to claim 9, wherein the second reference voltage is higher than a threshold voltage of the reference memory transistor.

12. A camera according to claim 9, wherein each of the memory transistor and the reference memory transistor comprises an active region, a charge accumulating region, and a control gate, and the charge accumulating region is provided between the active region and the control gate and overlaps the control gate.

13. A camera according to claim 9, wherein each of the memory transistor and the reference memory transistor comprises an active region, a floating gate, and a control gate, and the floating gate is provided between the active region and the control gate and overlaps the control gate.

14. A camera according to claim 9, wherein each of the memory transistor and the reference memory transistor comprises an active region, a nitride film, and a control gate, and the nitride film is provided between the active region and the control gate and overlaps the control gate.

15. A camera according to claim 9, wherein each of the memory transistor and the reference memory transistor comprises an active region, a cluster layer, and a control gate, and the cluster is provided between the active region and the control gate and overlaps the control gate.

16. A camera according to claim 9, wherein the memory transistor and the reference memory transistor store multi-level information.

17. A camera comprising:
a display portion; and
a nonvolatile memory, the nonvolatile memory comprising:
a unit cell in which multiple memory transistors are connected in series;
a reference memory transistor;
a first circuit for electrically reading a threshold voltage of the memory transistor by using a threshold voltage of the reference memory transistor;
a second circuit for performing electrical write on the memory transistor until the threshold voltage of the memory transistor is higher than a first reference voltage; and a third circuit for performing electrical write on the reference memory transistor until the threshold voltage of the reference memory transistor is higher than a second reference voltage.

18. A camera according to claim 17, wherein the first reference voltage is higher than the second reference voltage.

19. A camera according to claim 17, wherein the second reference voltage is higher than a threshold voltage of the reference memory transistor.

20. A camera according to claim 17, wherein each of the memory transistor and the reference memory transistor comprises an active region, a charge accumulating region, and a control gate, and the charge accumulating region is provided between the active region and the control gate and overlaps the control gate.

21. A camera according to claim 17, wherein each of the memory transistor and the reference memory transistor comprises an active region, a floating gate, and a control gate, and the floating gate is provided between the active region and the control gate and overlaps the control gate.

22. A camera according to claim 17, wherein each of the memory transistor and the reference memory transistor comprises an active region, a nitride film, and a control gate, and the nitride film is provided between the active region and the control gate and overlaps the control gate.

23. A camera according to claim 17, wherein each of the memory transistor and the reference memory transistor comprises an active region, a cluster layer, and a control gate, and the cluster is provided between the active region and the control gate and overlaps the control gate.

24. A camera according to claim 17, wherein the memory transistor and the reference memory transistor store multi-level information.

25. A camera comprising:
a display portion; and
a nonvolatile memory the nonvolatile memory comprising:
a unit cell in which multiple memory transistors are connected in series;
a reference memory transistor;
a first circuit for performing electrical write on the memory transistor until a first threshold voltage of the memory transistor, which is read from a reference voltage of the reference memory transistor, and a second threshold voltage of the memory transistor, which is read from a first reference voltage of the reference memory transistor belong to a distribution of threshold voltages for same information; and
a second circuit for performing electrical write on the reference memory transistor until a threshold voltage of the reference memory transistor is higher than a second reference voltage.

26. A camera according to claim 25, wherein the first reference voltage is higher than the second reference voltage.

27. A camera according to claim 25, wherein the second reference voltage is higher than a threshold voltage of the reference memory transistor.

28. A camera according to claim 25, wherein each of the memory transistor and the reference memory transistor comprises an active region, a charge accumulating region, and a control gate, and the charge accumulating region is provided between the active region and the control gate and overlaps the control gate.

29. A camera according to claim 25, wherein each of the memory transistor and the reference memory transistor comprises an active region, a floating gate, and a control gate, and the floating gate is provided between the active region and the control gate and overlaps the control gate.

30. A camera according to claim 25, wherein each of the memory transistor and the reference memory transistor comprises an active region, a nitride film, and a control gate, and the nitride film is provided between the active region and the control gate and overlaps the control gate.

31. A camera according to claim 25, wherein each of the memory transistor and the reference memory transistor comprises an active region, a cluster layer, and a control gate, and the cluster is provided between the active region and the control gate and overlaps the control gate.

32. A camera according to claim 25, wherein the memory transistor and the reference memory transistor store multilevel information.

33. A camera comprising:
a display portion; and
a nonvolatile memory, the nonvolatile memory comprising:
a memory transistor;
a reference memory transistor;
a timer;
a first circuit for performing electrical write on the memory transistor for each time when an elapsed time measured by the timer reaches an arbitrarily preset time until a threshold voltage of the memory transistor, which is read based on a reference voltage of the reference memory transistor is higher than a first reference voltage; and
a second circuit for performing electrical write on the reference memory transistor until a threshold voltage of the reference memory transistor is higher than a second reference voltage.

34. A camera according to claim 33, wherein the first reference voltage is higher than the second reference voltage.

35. A camera according to claim 33, wherein the second reference voltage is higher than a threshold voltage of the reference memory transistor.

36. A camera according to claim 33, wherein each of the memory transistor and the reference memory transistor comprises an active region, a charge accumulating region, and a control gate, and the charge accumulating region is provided between the active region and the control gate and overlaps the control gate.

37. A camera according to claim 33, wherein each of the memory transistor and the reference memory transistor comprises an active region, a floating gate, and a control gate, and the floating gate is provided between the active region and the control gate and overlaps the control gate.

38. A camera according to claim 33, wherein each of the memory transistor and the reference memory transistor comprises an active region, a nitride film, and a control gate, and the nitride film is provided between the active region and the control gate and overlaps the control gate.

39. A camera according to claim 33, wherein each of the memory transistor and the reference memory transistor comprises an active region, a cluster layer, and a control gate, and the cluster is provided between the active region and the control gate and overlaps the control gate.

40. A camera according to claim 33, wherein the memory transistor and the reference memory transistor store multilevel information.

41. A mobile information terminal comprising:
a display portion; and
a nonvolatile memory, the nonvolatile memory comprising:
a memory transistor;
a reference memory transistor;
a first circuit for electrically reading a threshold voltage of the memory transistor by using a threshold voltage of the reference memory transistor;
a second circuit for performing electrical write on the memory transistor until the threshold voltage of the memory transistor is higher than a first reference voltage; and
a third circuit for performing electrical write on the reference memory transistor until the threshold voltage of the reference memory transistor is higher than a second reference voltage.

42. A mobile information terminal according to claim 41, wherein the first reference voltage is higher than the second reference voltage.

43. A mobile information terminal according to claim 41, wherein the second reference voltage is higher than a threshold voltage of the reference memory transistor.

44. A mobile information terminal according to claim 41, wherein each of the memory transistor and the reference memory transistor comprises an active region, a charge accumulating region, and a control gate, and the charge accumulating region is provided between the active region and the control gate and overlaps the control gate.

45. A mobile information terminal according to claim 41, wherein each of the memory transistor and the reference memory transistor comprises an active region, a floating gate, and a control gate, and the floating gate is provided between the active region and the control gate and overlaps the control gate.

46. A mobile information terminal according to claim 41, wherein each of the memory transistor and the reference memory transistor comprises an active region, a nitride film, and a control gate, and the nitride film is provided between the active region and the control gate and overlaps the control gate.

47. A mobile information terminal according to claim 41, wherein each of the memory transistor and the reference memory transistor comprises an active region, a cluster layer, and a control gate, and the cluster is provided between the active region and the control gate and overlaps the control gate.

48. A mobile information terminal according to claim 41, wherein the memory transistor and the reference memory transistor store multilevel information.

49. A mobile information terminal comprising:
a display portion; and
a nonvolatile memory, the nonvolatile memory comprising:
a memory transistor;
a reference memory transistor;
a first circuit for performing electrical write on the memory transistor until a first threshold voltage of the memory transistor, which is read based on a reference voltage of the reference memory transistor, and a second threshold voltage of the memory transistor, which is read based on a first reference voltage of the reference memory transistor belong to a distribution of threshold voltages for same information; and
a second circuit for performing electrical write on the reference memory transistor until a threshold voltage of the reference memory transistor is higher than a second reference voltage.

50. A mobile information terminal according to claim 49, wherein the first reference voltage is higher than the second reference voltage.

51. A mobile information terminal according to claim 49, wherein the second reference voltage is higher than a threshold voltage of the reference memory transistor.

52. A mobile information terminal according to claim 49, wherein each of the memory transistor and the reference memory transistor comprises an active region, a charge accumulating region, and a control gate, and the charge accumulating region is provided between the active region and the control gate and overlaps the control gate.

53. A mobile information terminal according to claim 49, wherein each of the memory transistor and the reference memory transistor comprises an active region, a floating gate, and a control gate, and the floating gate is provided between the active region and the control gate and overlaps the control gate.

54. A mobile information terminal according to claim 49, wherein each of the memory transistor and the reference memory transistor comprises an active region, a nitride film, and a control gate, and the nitride film is provided between the active region and the control gate and overlaps the control gate.

55. A mobile information terminal according to claim 49, wherein each of the memory transistor and the reference memory transistor comprises an active region, a cluster layer, and a control gate, and the cluster is provided between the active region and the control gate and overlaps the control gate.

56. A mobile information terminal according to claim 49, wherein the memory transistor and the reference memory transistor store multilevel information.

57. A mobile information terminal comprising:
a display portion; and
a nonvolatile memory, the nonvolatile memory comprising:
a unit cell in which multiple memory transistors are connected in series;
a reference memory transistor;
a first circuit for electrically reading a threshold voltage of the memory transistor by using a threshold voltage of the reference memory transistor;
a second circuit for performing electrical write on the memory transistor until the threshold voltage of the memory transistor is higher than a first reference voltage; and
a third circuit for performing electrical write on the reference memory transistor until the threshold voltage of the reference memory transistor is higher than a second reference voltage.

58. A mobile information terminal according to claim 57, wherein the first reference voltage is higher than the second reference voltage.

59. A mobile information terminal according to claim 57, wherein the second reference voltage is higher than a threshold voltage of the reference memory transistor.

60. A mobile information terminal according to claim 57, wherein each of the memory transistor and the reference memory transistor comprises an active region, a charge accumulating region, and a control gate, and the charge accumulating region is provided between the active region and the control gate and overlaps the control gate.

61. A mobile information terminal according to claim 57, wherein each of the memory transistor and the reference memory transistor comprises an active region, a floating gate, and a control gate, and the floating gate is provided between the active region and the control gate and overlaps the control gate.

62. A mobile information terminal according to claim 57, wherein each of the memory transistor and the reference memory transistor comprises an active region, a nitride film, and a control gate, and the nitride film is provided between the active region and the control gate and overlaps the control gate.

63. A mobile information terminal according to claim 57, wherein each of the memory transistor and the reference memory transistor comprises an active region, a cluster layer, and a control gate, and the cluster is provided between the active region and the control gate and overlaps the control gate.

64. A mobile information terminal according to claim 57, wherein the memory transistor and the reference memory transistor store multilevel information.

65. A mobile information terminal comprising:
a display portion; and
a nonvolatile memory the nonvolatile memory comprising:
a unit cell in which multiple memory transistors are connected in series;
reference memory transistor;
a first circuit for performing electrical write on the memory transistor until a first threshold voltage of the memory transistor, which is read from a reference voltage of the reference memory transistor, and a second threshold voltage of the memory transistor, which is read from a first reference voltage of the reference memory transistor belong to a distribution of threshold voltages for same information; and
a second circuit for performing electrical write on the reference memory transistor until a threshold voltage of the reference memory transistor is higher than a second reference voltage.

66. A mobile information terminal a according to claim 65, wherein the first reference voltage is higher than the second reference voltage.

67. A mobile information terminal according to claim 65, wherein the second reference voltage is higher than a threshold voltage of the reference memory transistor.

68. A mobile information terminal according to claim 65, wherein each of the memory transistor and the reference memory transistor comprises an active region, a charge accumulating region, and a control gate, and the charge accumulating region is provided between the active region and the control gate and overlaps the control gate.

69. A mobile information terminal a according to claim 65, wherein each of the memory transistor and the reference memory transistor comprises an active region, a floating gate, and a control gate, and the floating gate is provided between the active region and the control gate and overlaps the control gate.

70. A mobile information terminal according to claim 65, wherein each of the memory transistor and the reference memory transistor comprises an active region, a nitride film, and a control gate, and the nitride film is provided between the active region and the control gate and overlaps the control gate.

71. A mobile information terminal according to claim 65, wherein each of the memory transistor and the reference memory transistor comprises an active region, a cluster layer, and a control gate, and the cluster is provided between the active region and the control gate and overlaps the control gate.

72. A mobile information terminal according to claim 65, wherein the memory transistor and the reference memory transistor store multilevel information.

73. A mobile information terminal comprising:
a display portion; and
a nonvolatile memory, the nonvolatile memory comprising:
a memory transistor;
a reference memory transistor;
a timer;
a first circuit for performing electrical write on the memory transistor for each time when an elapsed time measured by the timer reaches an arbitrarily preset time until a threshold voltage of the memory transistor, which is read based on a reference voltage of the reference memory transistor is higher than a first reference voltage; and
a second circuit for performing electrical write on the reference memory transistor until a threshold voltage of the reference memory transistor is higher than a second reference voltage.

74. A mobile information terminal according to claim 73, wherein the first reference voltage is higher than the second reference voltage.

75. A mobile information terminal according to claim 73, wherein the second reference voltage is higher than a threshold voltage of the reference memory transistor.

76. A mobile information terminal a according to claim 73, wherein each of the memory transistor and the reference memory transistor comprises an active region, a charge accumulating region, and a control gate, and the charge accumulating region is provided between the active region and the control gate and overlaps the control gate.

77. A mobile information terminal according to claim 73, wherein each of the memory transistor and the reference memory transistor comprises an active region, a floating gate, and a control gate, and the floating gate is provided between the active region and the control gate and overlaps the control gate.

78. A mobile information terminal according to claim 73, wherein each of the memory transistor and the reference memory transistor comprises an active region, a nitride film, and a control gate, and the nitride film is provided between the active region and the control gate and overlaps the control gate.

79. A mobile information terminal according to claim 73, wherein each of the memory transistor and the reference memory transistor comprises an active region, a cluster layer, and a control gate, and the cluster is provided between the active region and the control gate and overlaps the control gate.

80. A mobile information terminal according to claim 73, wherein the memory transistor and the reference memory transistor store multilevel information.

81. A nonvolatile memory comprising:
a memory transistor;
a reference memory transistor;
a verify circuit;
a read circuit comprising a sense amplifier circuit having:
a first input terminal electrically connected to the memory transistor;
a second input terminal electrically connected to the reference memory transistor; and
an output terminal electrically connected to the verify circuit;
a first reference voltage supply electrically connected to the first input terminal and the second input terminal;
a second reference voltage supply electrically connected to the first input terminal and the second input terminal; and
a write circuit electrically connected to the verify circuit, the memory transistor and the reference memory transistor.

82. A nonvolatile memory according to claim 81, wherein a voltage supplied by the first reference voltage supply is higher than a voltage supplied by the second reference voltage supply.

83. A nonvolatile memory according to claim 81, wherein a voltage supplied by the second reference voltage supply is higher than a threshold voltage of the reference memory transistor.

84. A nonvolatile memory according to claim 81, wherein the memory transistor and the reference memory transistor store multilevel information.

85. A nonvolatile memory comprising:
a memory transistor;
a reference memory transistor;
a verify circuit;
a read circuit comprising:
a first bias circuit electrically connected to the memory transistor;
a second bias circuit electrically connected to the reference memory transistor;
a data latch circuit electrically connected to the verify circuit; and
a sense amplifier circuit having:
a first input terminal electrically connected to the first bias circuit;
a second input terminal electrically connected to the second bias circuit; and
an output terminal electrically connected to the latch circuit;
a first reference voltage supply electrically connected to the first input terminal and the second input terminal;
a second reference voltage supply electrically connected to the first input terminal and the second input terminal; and
a write circuit electrically connected to the verify circuit, the memory transistor and the reference memory transistor.

86. A nonvolatile memory according to claim 85, wherein a voltage supplied by the first reference voltage supply is higher than a voltage supplied by the second reference voltage supply.

87. A nonvolatile memory according to claim 85, wherein a voltage supplied by the second reference voltage supply is higher than a threshold voltage of the reference memory transistor.

88. A nonvolatile memory according to claim 85, wherein the memory transistor and the reference memory transistor store multilevel information.

89. A nonvolatile memory comprising:
a first power source;
a second power source;
a memory transistor electrically connected to the first power source;
a reference memory transistor electrically connected to the first power source;

a verify circuit;

a read circuit comprising:

a first resistance electrically connected between the memory transistor and the second power source;

a second resistance electrically connected between the reference memory transistor and the second power source;

a data latch circuit electrically connected to the verify circuit; and a sense amplifier circuit having:

a first input terminal electrically connected to the memory transistor via a first switch;

a second input terminal electrically connected to the reference memory transistor via a second switch; and an output terminal electrically connected to the latch circuit;

a first reference voltage supply electrically connected to the first input terminal via the first switch, and the second input terminal via the second switch;

a second reference voltage supply electrically connected to the first input terminal via the first switch, and the second input terminal via the second switch; and a write circuit electrically connected to the verify circuit, the memory transistor and the reference memory transistor.

90. A nonvolatile memory according to claim 89, wherein a voltage supplied by the first reference voltage supply is higher than a voltage supplied by the second reference voltage supply.

91. A nonvolatile memory according to claim 89, wherein a voltage supplied by the second reference voltage supply is higher than a threshold voltage of the reference memory transistor.

92. A nonvolatile memory according to claim 89, wherein the memory transistor and the reference memory transistor store multilevel information.

* * * * *